US011956943B2

(12) United States Patent
Zhu et al.

(10) Patent No.: US 11,956,943 B2
(45) Date of Patent: Apr. 9, 2024

(54) MEMORY AND MANUFACTURING METHOD THEREOF, AND ELECTRONIC DEVICE

(71) Applicant: Beijing Superstring Academy of Memory Technology, Beijing (CN)

(72) Inventors: Zhengyong Zhu, Beijing (CN); Bokmoon Kang, Beijing (CN); Guilei Wang, Beijing (CN); Chao Zhao, Beijing (CN)

(73) Assignee: Beijing Superstring Academy of Memory Technology (CN)

( * ) Notice: Subject to any disclaimer, the term of this patent is extended or adjusted under 35 U.S.C. 154(b) by 0 days.

(21) Appl. No.: 18/139,766

(22) Filed: Apr. 26, 2023

(65) Prior Publication Data

US 2023/0320070 A1 Oct. 5, 2023

Related U.S. Application Data

(63) Continuation of application No. PCT/CN2022/097706, filed on Jun. 8, 2022.

(30) Foreign Application Priority Data

Apr. 2, 2022 (CN) .......................... 202210351082.9

(51) Int. Cl.
*H10B 12/00* (2023.01)
(52) U.S. Cl.
CPC ............. *H10B 12/30* (2023.02); *H10B 12/03* (2023.02); *H10B 12/05* (2023.02)
(58) Field of Classification Search
CPC ......... H10B 12/03; H10B 12/05; H10B 12/30
See application file for complete search history.

(56) References Cited

U.S. PATENT DOCUMENTS 5,022,003 A * 6/1991 Kohno ................... G11C 7/062
365/185.21
6,069,819 A * 5/2000 Tiwari ................... H10B 12/05
257/E21.654

(Continued)

FOREIGN PATENT DOCUMENTS

| CN | 1855505 A | 11/2006 |
| CN | 104681631 A | 6/2015 |
| CN | 114863970 A | 8/2022 |

OTHER PUBLICATIONS

International Search Report for PCT/CN2022/097706 dated Nov. 2, 2022. 4 pgs. [See p. 2 &4 , categorizing the cited references].

(Continued)

*Primary Examiner* — Mohammad M Hoque
*Assistant Examiner* — Kevin Quinto
(74) *Attorney, Agent, or Firm* — Lerner David LLP

(57) ABSTRACT

A memory comprises a substrate, and word lines, bit lines and memory cells located on one side of the substrate. Each of the memory cells comprises a transistor comprising: a semiconductor layer comprising a source contact region, a channel region and a drain contact region connected sequentially; a primary gate electrically connected to one of the word lines; a source electrically connected to one of the bit lines and the source contact region of the semiconductor layer, respectively; a drain electrically connected to the drain contact region of the semiconductor layer; and a secondary gate electrically connected to the drain, wherein an orthographic projection of the primary gate on the substrate and an orthographic projection of the secondary gate on the substrate are at least partially overlapped with an orthographic projection of the channel region of the semiconductor layer on the substrate, respectively.

13 Claims, 10 Drawing Sheets

(56) References Cited

U.S. PATENT DOCUMENTS

| | | |
|---|---|---|
| 2003/0137892 A1 | 7/2003 | Arimoto et al. |
| 2006/0054958 A1 | 3/2006 | Weis et al. |
| 2008/0061346 A1 | 3/2008 | Tang et al. |
| 2018/0315769 A1 | 11/2018 | Huo et al. |

OTHER PUBLICATIONS

Office Action for Chinese Application No. 202210351082.9 dated Oct. 19, 2022. 11 pgs.

* cited by examiner

MEMORY AND MANUFACTURING METHOD THEREOF, AND ELECTRONIC DEVICE

CROSS-REFERENCE TO RELATED APPLICATIONS

The present disclosure is a continuation of PCT International Application No. PCT/CN2022/097706, filed on Jun. 8, 2022, which claims the priority to Chinese Patent Application No. 202210351082.9 filed on Apr. 2, 2022 in the State Intellectual Property Office of China, which is incorporated herein by reference in its entirety.

TECHNICAL FIELD

The present disclosure relates to the technical field of storage, and in particular to a memory and a manufacturing method thereof, and an electronic device.

BACKGROUND

A random access memory (RAM) usually includes a transistor and a storage structure (e.g., a capacitor), where the transistor can control the storage structure to complete read or write tasks. Thus, it can be seen that the performance of the transistor has a great impact on the reading/writing performance of the whole memory.

SUMMARY

The present disclosure provides a memory and a manufacturing method thereof, and an electronic device for improving the reading/writing performance of the memory.

In a first aspect, the present disclosure provides a memory, including a substrate, and word lines, bit lines and memory cells located on one side of the substrate, wherein each of the memory cells includes a transistor, and the transistor includes: a semiconductor layer, which includes a source contact region, a channel region and a drain contact region connected sequentially; a primary gate, which is electrically connected to one of the word lines; a source, which is electrically connected to one of the bit lines and the source contact region of the semiconductor layer, respectively; a drain, which is electrically connected to the drain contact region of the semiconductor layer; and a secondary gate, which is electrically connected to the drain; wherein an orthographic projection of the primary gate on the substrate and an orthographic projection of the secondary gate on the substrate are at least partially overlapped with an orthographic projection of the channel region of the semiconductor layer on the substrate.

In some embodiments, the primary gate is located between the substrate and the semiconductor layer; or the primary gate is located on one side of the semiconductor layer away from the substrate.

In some embodiments, the primary gate and the secondary gate are located on two opposite sides of the semiconductor layer, respectively.

In some embodiments, each of the memory cells further includes a storage structure; and the storage structure includes a capacitor storage structure formed between the secondary gate and a first electrode.

In some embodiments, the first electrode is the source, and an orthographic projection of the source on the substrate is partially overlapped with the orthographic projection of the secondary gate on the substrate.

In some embodiments, the primary gate is located on one side of the semiconductor layer away from the substrate, the secondary gate is located between the substrate and the semiconductor layer, and the first electrode is located between the substrate and the secondary gate.

In some embodiments, the primary gate is located between the substrate and the semiconductor layer, the secondary gate is located on one side of the semiconductor layer away from the substrate, and the first electrode is located on one side of the secondary gate away from the substrate.

In some embodiments, the transistor further includes: a first dielectric layer, which is located between the semiconductor layer and the primary gate; and a second dielectric layer, which is located between the secondary gate and the semiconductor layer and between the secondary gate and the source, an orthographic projection of the source on the substrate being partially overlapped with the orthographic projection of the secondary gate on the substrate.

In some embodiments, the primary gate is located on one side of the semiconductor layer away from the substrate, and the secondary gate is located between the substrate and the semiconductor layer; the transistor further includes a first insulating layer, a first via hole and a second via hole; the first insulating layer is located on one side of the primary gate away from the substrate; the one of the bit lines is located on one side of the first insulating layer away from the primary gate; the first via hole passes through the first insulating layer and the first dielectric layer, respectively, and is connected to the one of the bit lines and the source contact region of the semiconductor layer, respectively, and at least part of an entirety including the first via hole and the source contact region of the semiconductor layer forms the source; and the second via hole passes through the first insulating layer, the first dielectric layer and the second dielectric layer, respectively, and is connected to the drain contact region of the semiconductor layer and the secondary gate, respectively, and at least part of an entirety including the second via hole and the drain contact region of the semiconductor layer forms the drain.

In some embodiments, the primary gate is located between the substrate and the semiconductor layer, and the secondary gate is located on one side of the semiconductor layer away from the substrate; the transistor further comprises a first insulating layer, a first via hole and a second via hole; the first insulating layer is located on one side of the secondary gate away from the substrate; the one of the bit lines is located on one side of the first insulating layer away from the secondary gate; the first via hole passes through the first insulating layer and the second dielectric layer, respectively, and is connected to the one of the bit lines and the source contact region of the semiconductor layer, respectively, and at least part of an entirety including the first via hole and the source contact region of the semiconductor layer forms the source; and the second via hole passes through the first insulating layer and the second dielectric layer, and is connected to the secondary gate and the drain contact region of the semiconductor layer, respectively, and at least part of an entirety including the second via hole and the drain contact region of the semiconductor layer forms the drain.

In some embodiments, the one of the word lines is arranged in the same layer as the primary gate and is located in a different layer from the bit line.

In some embodiments, the semiconductor layer comprises at least one of metal oxide semiconductor, monocrystalline silicon, polycrystalline silicon and amorphous silicon, wherein the metal oxide semiconductor includes at least one of indium, gallium, zinc, tin and tungsten.

In some embodiments, at least two of the memory cells are stacked in a direction perpendicular to the substrate; and/or at least two of the memory cells are arranged in an array on one side of the substrate, the primary gates of the transistors in at least two of the memory cells located in a same row are electrically connected to same one of the word lines, and the sources of the transistors in at least two of the memory cells located in a same column are electrically connected to same one of the bit lines.

In a second aspect, the present disclosure provides an electronic device, including any one of the above memories.

In a third aspect, the present disclosure provides a method for manufacturing a memory, including steps of: preparing a secondary gate, a second dielectric layer, a semiconductor layer, a first dielectric layer, a primary gate, a word line connected to the primary gate, and a first insulating layer sequentially on one side of a substrate, the semiconductor layer including a source contact region, a channel region and a drain contact region connected sequentially; etching the first insulating layer and the first dielectric layer sequentially to obtain a first through hole exposing at least part of the source contact region of the semiconductor layer; etching the first insulating layer, the first dielectric layer and the second dielectric layer sequentially to obtain a second through hole exposing at least part of the drain contact region of the semiconductor layer and part of the secondary gate; manufacturing conducting materials in the first through hole and the second through hole, respectively, so that a first via hole connected to the source contact region of the semiconductor layer is formed in the first through hole and a second via hole connected to the secondary gate and the drain contact region of the semiconductor layer is formed in the second through hole; and manufacturing a bit line on the first via hole.

In some embodiments, the step of preparing a secondary gate, a second dielectric layer, a semiconductor layer, a first dielectric layer, a primary gate, a word line connected to the primary gate, and a first insulating layer sequentially on one side of a substrate includes: preparing the secondary gate on the one side of the substrate; preparing the second dielectric layer on the secondary gate and the exposed substrate; preparing the semiconductor layer on the second dielectric layer, so that an orthographic projection of the channel region of the semiconductor layer on the substrate and an orthographic projection of the source contact region of the semiconductor layer on the substrate are partially overlapped with an orthographic projection of the secondary gate on the substrate, respectively; and conducting the source contact region and the drain contact region of the semiconductor layer.

In some embodiments, the step of etching the first insulating layer and the first dielectric layer sequentially to obtain a first through hole exposing at least part of the source contact region of the semiconductor layer and the step of etching the first insulating layer, the first dielectric layer and the second dielectric layer sequentially to obtain a second through hole exposing at least part of the drain contact region of the semiconductor layer and part of the secondary gate are performed synchronously.

In a fourth aspect, the present disclosure provides a method for manufacturing a memory, including steps of: preparing a primary gate, a word line connected to the primary gate, a first dielectric layer, a semiconductor layer, a second dielectric layer, a secondary gate and a first insulating layer sequentially on one side of a substrate, the semiconductor layer including a source contact region, a channel region and a drain contact region connected sequentially; etching the first insulating layer and the second dielectric layer sequentially to obtain a first through hole exposing at least part of the source contact region of the semiconductor layer; etching the first insulating layer and the second dielectric layer sequentially to obtain a second through hole exposing part of the primary gate and at least part of the drain contact region of the semiconductor layer; manufacturing conducting materials in the first through hole and the second through hole, respectively, so that a first via hole connected to the source contact region of the semiconductor layer is formed in the first through hole and a second via hole connected to the secondary gate and the drain contact region of the semiconductor layer is formed in the second through hole; and manufacturing a bit line on the first via hole.

In some embodiments, the step of preparing a primary gate, a word line connected to the primary gate, a first dielectric layer, a semiconductor layer, a second dielectric layer, a secondary gate and a first insulating layer sequentially on one side of a substrate includes: preparing the primary gate and the word line connected to the primary gate on the one side of the substrate; preparing the first dielectric layer on the primary gate, the word line connected to the primary gate and the exposed substrate; preparing the semiconductor layer on the first dielectric layer, so that an orthographic projection of the channel region of the semiconductor layer on the substrate is partially overlapped with an orthographic projection of the primary gate on the substrate; conducting the source contact region and the drain contact region of the semiconductor layer; preparing the second dielectric layer on the semiconductor layer and the exposed first dielectric layer; and, preparing the secondary gate on the second dielectric layer, so that an orthographic projection of the secondary gate on the substrate is partially overlapped with the orthographic projection of the channel region of the semiconductor layer on the substrate and an orthographic projection of the source contact region of the semiconductor layer on the substrate, respectively.

In some embodiments, the step of etching the first insulating layer and the second dielectric layer sequentially to obtain a first through hole exposing at least part of the source contact region of the semiconductor layer and the step of etching the first insulating layer and the second dielectric layer sequentially to obtain a second through hole exposing part of the primary gate and at least part of the drain contact region of the semiconductor layer are performed synchronously.

Additional aspects and advantages of the present disclosure will be partially appreciated and become apparent from the descriptions below, or will be well learned from the practices of the present application.

BRIEF DESCRIPTION OF THE DRAWINGS

The above and/or additional aspects and advantageous of the present disclosure will become apparent and be more readily appreciated from the following descriptions of embodiments with reference to the drawings, in which.

in which:
10: memory cell; 101: secondary gate; 102: second dielectric layer; 103: semiconductor layer; 1031: source contact region; 1032: drain contact region; 1033: channel region; 104: first dielectric layer; 105: primary gate; 106: first insulating layer; 107: first via hole; 108: second via hole; 109: planarization layer; 110: first electrode; 20: bit line; 30: word line; 100: memory cell group; 200: substrate; 300: buffer layer; 1: memory; and, 2: electronic device.

DETAILED DESCRIPTION

The embodiments of the present disclosure will be described below with reference to the drawings in the present disclosure. It should be understood that the implementations described below with reference to the drawings are exemplary descriptions for explaining the technical solutions of the embodiments of the present disclosure and are not intended to limit the technical solutions of the embodiments of the present application.

It should be understood by those skilled in the art that singular forms "a", "an", "the" and "this" as used herein may include plural forms as well, unless specifically stated. It should be further understood that the word "comprise/include" used in this specification of the present disclosure specifies the presence of the stated features, integers, steps, operations, elements and/or components, but does not exclude the implementation as other features, information, data, steps, operations, elements, components and/or combinations thereof supported in the art. It should be understood that, when an element is "connected" or "coupled" to another element, this element may be directly connected or coupled to the another element, or this element may be connected to the another element through an intervening element. In addition, as used herein, the "connection" or "coupling" may include wireless connection or wireless coupling. As used herein, the term "and/or" indicates at least one of the items defined by this term. For example, "A and/or B" may be implemented as "A", or "B", or "A and B".

Figure 1:
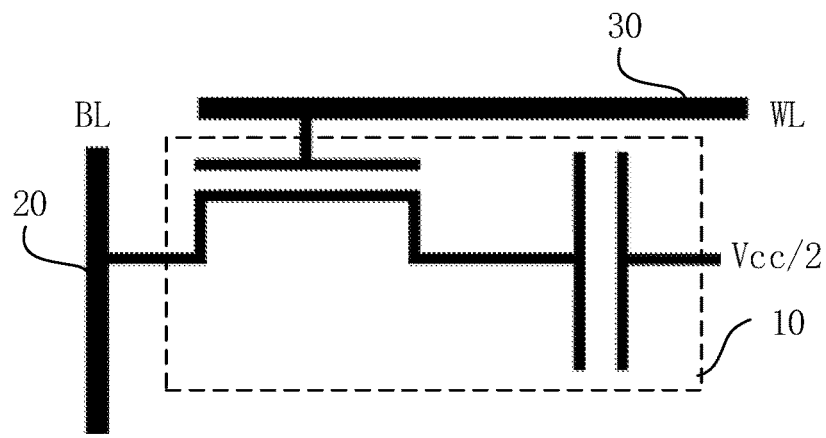
FIG. 1 is a schematic circuit diagram of a memory cell in the related art.

The development idea of the present disclosure is that, as shown in FIG. 1, the memory cell 10 of the DRAM usually consists of a transistor and a capacitor, i.e., being of a 1T1C structure. Since the phenomenon of current leakage across the channel occurs when the transistor is in the OFF state, the charge stored in the capacitor will be gradually lost, so that it is often necessary to perform frequent refreshing to ensure the validity of the stored data.

At present, to reduce the refresh rate of the mainstream DRAM, the conventional design is that the capacitor needs to be large enough, resulting in incompact structure and low integration of the DRAM.

In the embodiments of the present disclosure, the provided memory 1 is an access memory 1 including memory arrays, and each of the memory arrays includes a memory cell 10, e.g., a memory cell 10 in one memory array in the dynamic random access memory (DRAM) 1 or other types of memories 1.

Of course, it is not limited to the memory cell 10 in the memory array, and at least one of a plurality of memory cells 10 in a non-array form is also possible.

Each memory array at least includes memory cells 10 distributed in rows and columns, and each memory cell 10 includes at least one transistor, at least one word line 30 and at least bit line 20.

In some embodiments, the memory cell 10 may include a transistor, a memory 1, a word line 30 and a bit line 20.

In other embodiments, the memory cell 10 only includes a transistor, but may include two bit lines 20.

In still other embodiments, there may be more than one transistor.

In the memory cell 10 provided in the present disclosure, on the basis that the transistor has a primary gate 105 that can control the conductivity of the semiconductor layer 103, a secondary gate 101 that can also control the conductivity of the semiconductor layer 103 is introduced. The secondary gate 101 is electrically connected to the drain, so that the secondary gate 101 can obtain a fixed potential synchronized with the drain and provides supplementary control for the semiconductor layer 103 by using the fixed potential. In addition, the secondary gate 101 is not electrically connected to the source, so that the secondary gate 101 can play a role of the negative bias of the threshold voltage in the reading stage. Thus, the performance of the transistor can be improved, and the reading/writing performance of the memory 1 can be thus optimized.

The inventive concept of the present application will be explained below by the way of specific examples.

The memory and manufacturing method thereof and the electronic device provided by the present application are intended to solve the above technical problems in the prior art. In accordance with an embodiment of the present disclosure, a memory 1 is provided, as shown in FIGS. 2-8, including a substrate 200, and word lines 30, bit lines 20 and memory cells 10 which are all located on one side of the substrate 200.

Each of the memory cells 10 includes a transistor, and the transistor includes a semiconductor layer 103, a primary gate 105, a source, a drain and a secondary gate 101.

The semiconductor layer 103 includes a source contact region 1031, a channel region 1033 and a drain contact region 1032 that are connected sequentially.

The primary gate 105 is electrically connected to a word line 30.

The source is electrically connected to a bit line 20 and the source contact region 1031 of the semiconductor layer 103, respectively.

The drain is electrically connected to the drain contact region 1032 of the semiconductor layer 103.

The secondary gate 101 is electrically connected to the drain.

An orthographic projection of the primary gate 105 on the substrate 200 and an orthographic projection of the secondary gate 101 on the substrate 200 are at least partially overlapped with an orthographic projection of the channel region 1033 of the semiconductor layer 103 on the substrate 200, respectively.

The memory 1 provided in the present disclosure has an optimized structure. Specifically, on the basis that the transistor has a primary gate 105 that can control the conductivity of the semiconductor layer 103, a secondary gate 101 that can also control the conductivity of the semiconductor layer 103 is introduced. The secondary gate 101 is electrically connected to the drain, so that the secondary gate 101 can obtain a fixed potential synchronized with the drain and provides supplementary control for the semiconductor layer 103 by using the fixed potential. In addition, the secondary gate 101 is not electrically connected to the source, so that the secondary gate 101 can play a role of the negative bias of the threshold voltage in the reading stage. Thus, the performance of the transistor can be improved, and the reading/writing performance of the memory 1 can be thus optimized.

It is to be noted that, the secondary gate 101 in this embodiment is electrically connected to the drain and can obtain a fixed potential synchronized with the drain, so the secondary gate 101 is not a floating gate.

Figure 6:
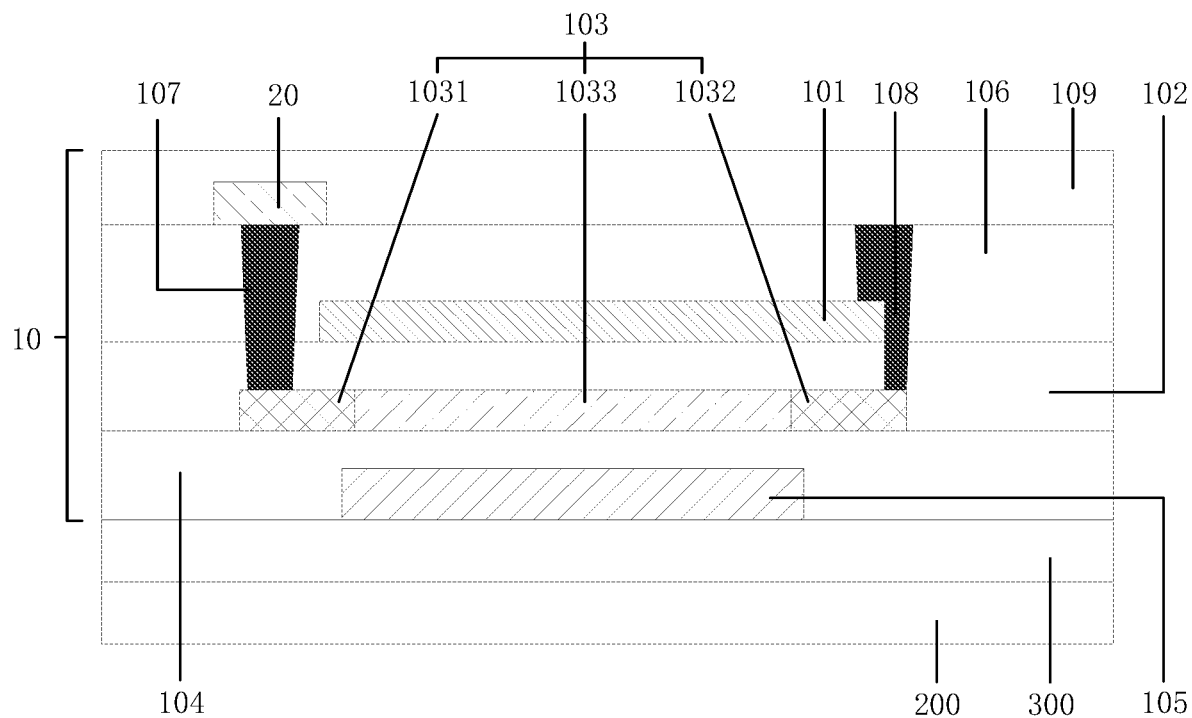
FIG. 6 is a schematic structure diagram of a second implementation of the memory cell according to an embodiment of the present disclosure.
Figure 8:
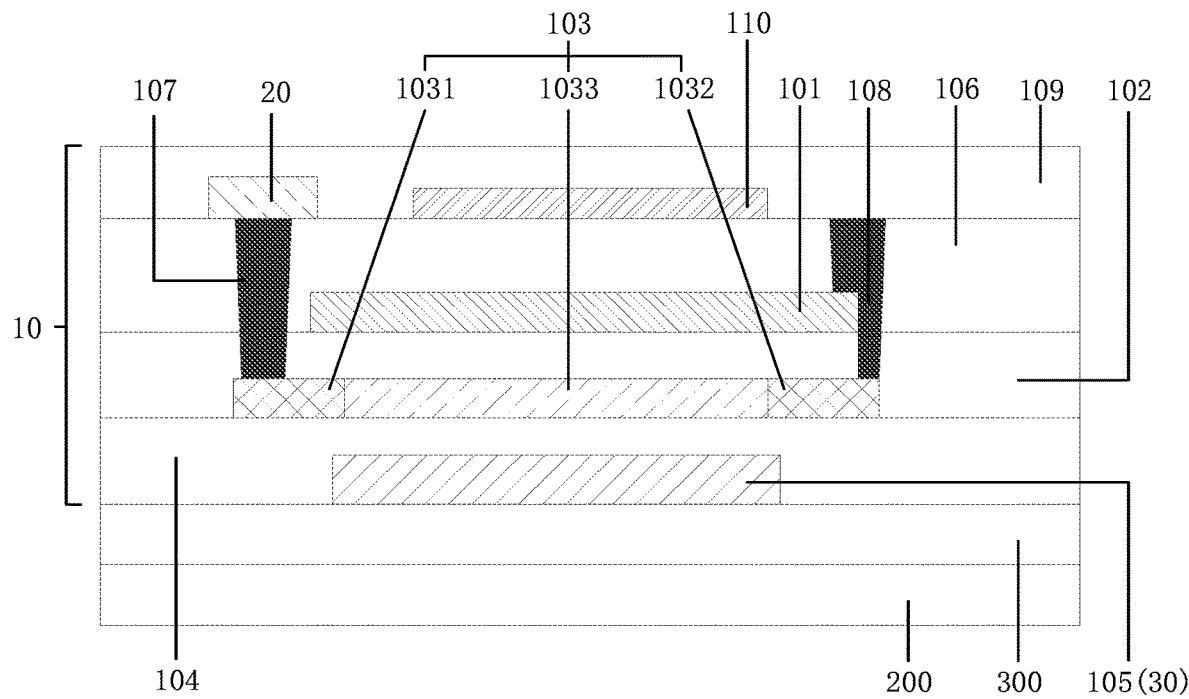
FIG. 8 is a schematic structure diagram of a fourth implementation of the memory cell according to an embodiment of the present disclosure.

In some embodiments, as shown in FIGS. 6 and 8, the primary gate 105 is located between the substrate 200 and the semiconductor layer 103. That is, the transistor may be of a bottom gate structure.

Figure 5:
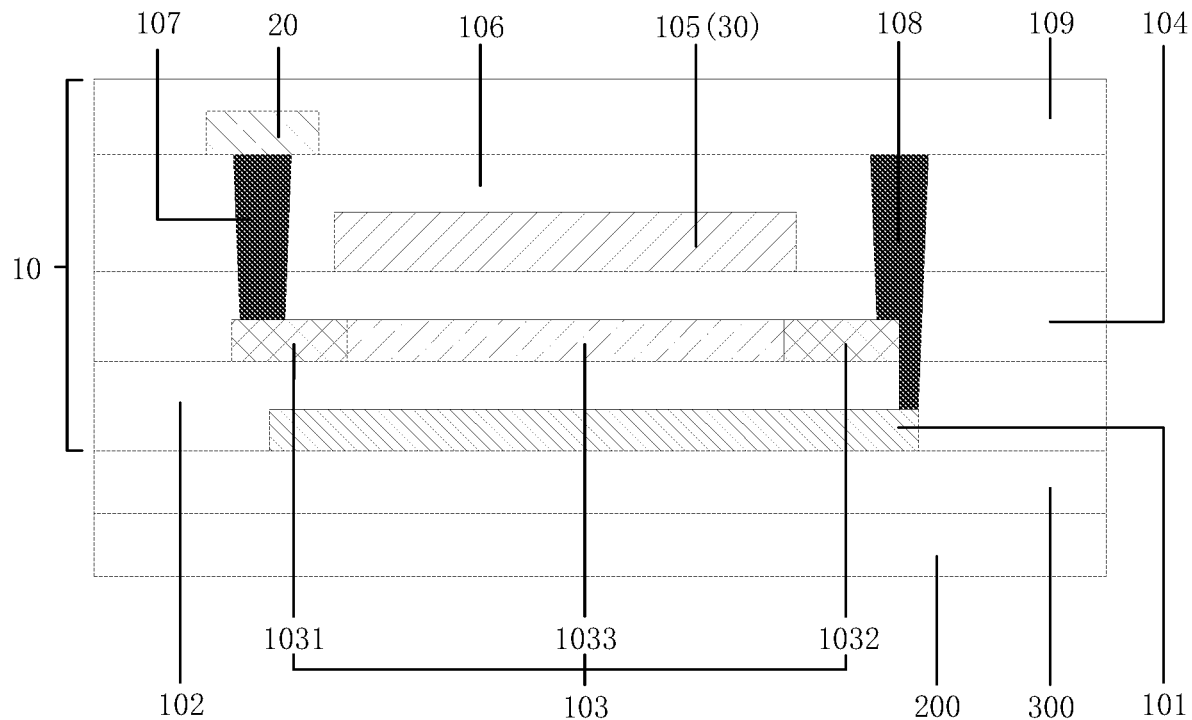
FIG. 5 is a schematic structure diagram of a first implementation of the memory cell according to an embodiment of the present disclosure.
Figure 7:
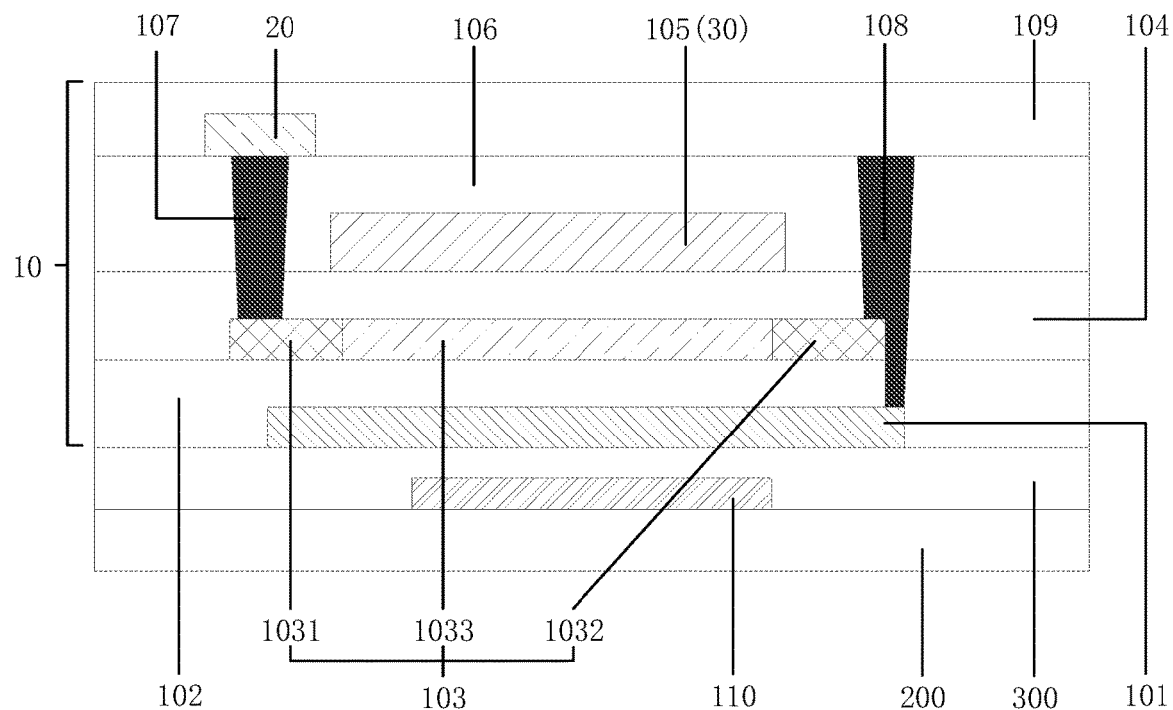
FIG. 7 is a schematic structure diagram of a third implementation of the memory cell according to an embodiment of the present disclosure.

In other embodiments, as shown in FIGS. 5 and 7, the primary gate 105 is located on one side of the semiconductor layer 103 away from the substrate 200. That is, the transistor may be of a top gate structure.

Based on the above possible embodiments, in still other embodiments, as shown in FIGS. 5-8, the primary gate 105 and the secondary gate 101 are located on two opposite sides of the semiconductor layer 103, respectively. Thus, the mutual interference between the primary gate 105 and the secondary gate 101 can be reduced, it is advantageous to increase the effective area of the primary gate 105 and the secondary gate 101 respectively acting on the semiconductor layer 103, and the performance of the transistor is improved. Specifically, in a case where the transistor is of a bottom gate structure, the primary gate 105 is located between the substrate 200 and the semiconductor layer 103, and the secondary gate 101 is located on one side of the semiconductor layer 103 away from the substrate 200; and, in a case where the transistor is of a top gate structure, the secondary gate 101 is located between the substrate 200 and the semiconductor layer 103, and the primary gate is located on one side of the semiconductor layer 103 away from the substrate 200.

The development idea of the present disclosure is that the memory cell 10 of the dynamic random access memory (DRAM) 1 usually includes a transistor and a storage structure (e.g., a capacitor), e.g., being of a 1T1C structure, and the capacitor is usually realized by a capacitive electrode. Since the phenomenon of current leakage across the channel occurs when the transistor is in the OFF state, at least part of the charge stored in the capacitor will be gradually lost in the form of leakage current, so that the stored data often needs to be refreshed frequently to ensure the validity of the stored data. In DRAM products, although the refresh rate can be reduced by increasing the area of the capacitive electrode to improve the storage capacitance, the increased area of the capacitive electrode will reduce the integration of the DRAM products.

Therefore, the present application provides the following possible implementation for the memory 1.

As shown in FIGS. 7 and 8, in some embodiments of the present disclosure, each of the memory cell 10 further includes a storage structure. The storage structure includes a capacitor storage structure formed between the secondary gate 101 and a first electrode 107.

In this embodiment, the memory cell 10 includes a capacitor storage structure formed between the secondary gate 101 and the first electrode 107, so that the data can be written and the current leakage of the transistor in the OFF state can be improved. By using the secondary gate as a part of the capacitor storage structure, it is advantageous for the device to realize relatively high integration.

Optionally, the first electrode 107 may be a special conducting structure that forms a capacitor storage structure with the secondary gate 101, or the first electrode 107 may be a conducting structure that has conductivity in other electrical structures in the memory 1 and can form a capacitor storage structure with the secondary gate 101.

In some embodiments, as shown in FIG. 7, the primary gate 105 is located on one side of the semiconductor layer 103 away from the substrate 200, the secondary gate 101 is located between the substrate 200 and the semiconductor layer 103, and the first electrode 107 is located between the substrate 200 and the secondary gate 101. That is, in a case where the primary gate 105 and the secondary gate 101 are located on two sides of the semiconductor layer 103, respectively, and the transistor is of a top gate structure, the first electrode 107 may be arranged closer to the substrate 200 than the secondary gate 101.

In some embodiments, as shown in FIG. 8, the primary gate 105 is located between the substrate 200 and the semiconductor layer 103, the secondary gate 101 is located on one side of the semiconductor layer 103 away from the substrate 200, and the first electrode 107 is located on one side of the secondary gate 101 away from the substrate 200. That is, in a case where the primary gate 105 and the secondary gate 101 are located on two sides of the semiconductor layer 103, respectively, and the transistor is of a bottom gate structure, the first electrode 107 may be arranged further away from the substrate 200 than the secondary gate 101.

In some embodiments, as shown in FIGS. 5 and 6, the first electrode 107 is the source, and the orthographic projection of the source on the substrate 200 is partially overlapped with the orthographic projection of the secondary gate 101 on the substrate 200.

In this embodiment, by using the source as another part of the capacitor storage structure and cooperating with the secondary gate 101 to realize data writing, the integration of the memory 1 is further improved. That is, the reading/writing of the data can be realized by providing only one transistor in the memory cell 10 of the memory 1, without additionally providing other transistors or capacitor devices, so that the structure of the memory cell 10 is greatly simplified and it is advantageous to improve the integration and storage density of the memory 1.

Figure 2:
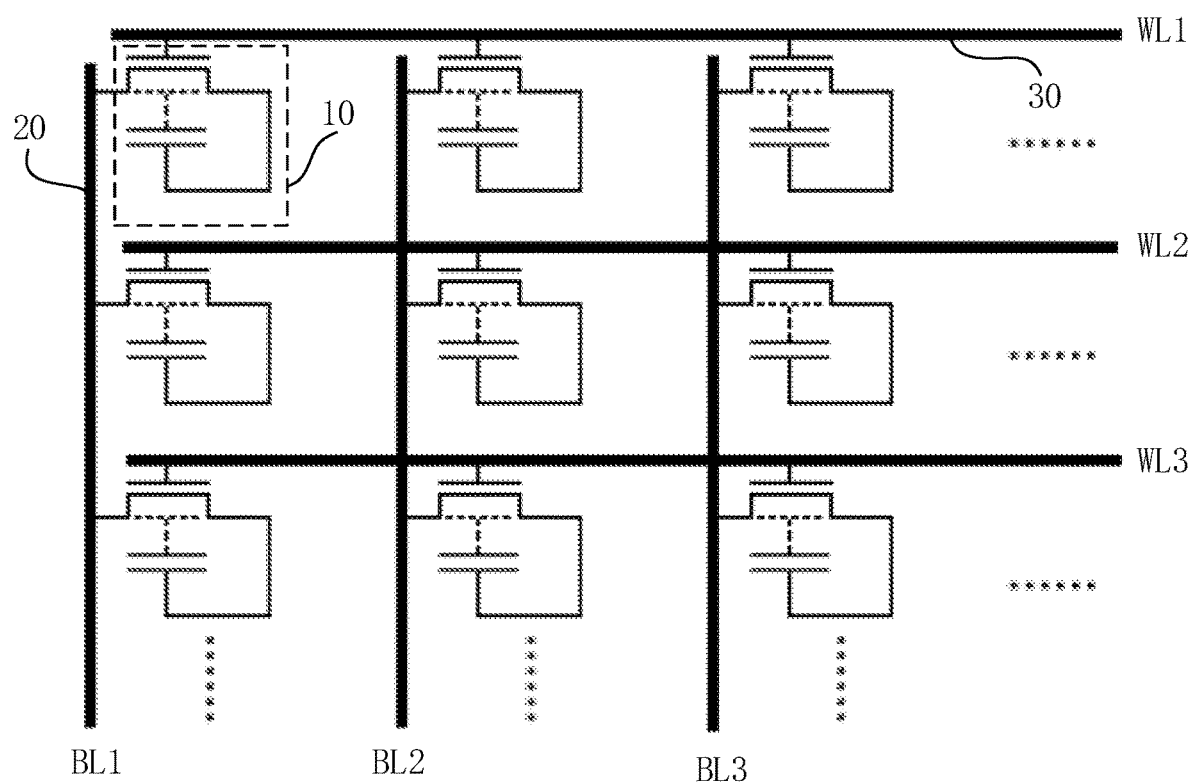
FIG. 2 is a schematic circuit diagram of a memory according to an embodiment of the present disclosure.
Figure 3:
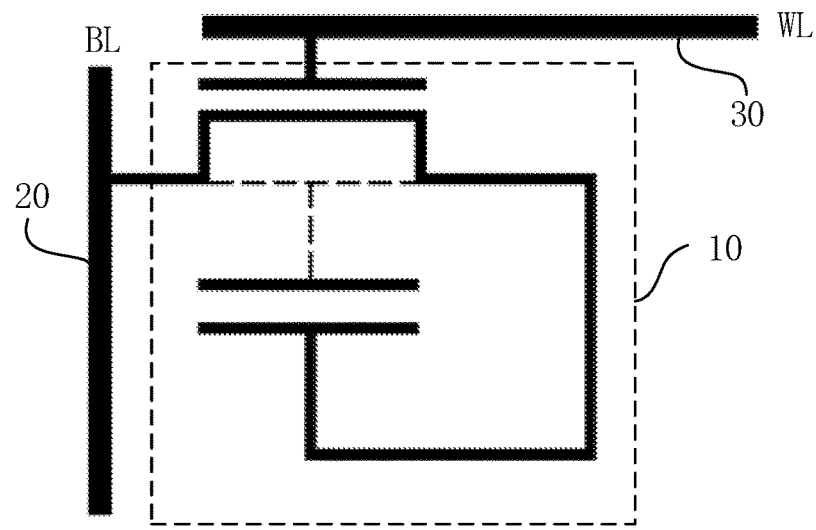
FIG. 3 is a schematic circuit diagram of a memory cell according to an embodiment of the present disclosure.

It is to be noted that, although the storage capacitor is shown in both FIGS. 2 and 3, actually, the storage capacitor is composed of the secondary gate 101 in the transistor, and the source and drain in the transistor. Since the secondary gate 101 has a back gate effect, that is, the potential of the secondary gate 101 will affect the threshold voltage of the transistor, the voltage used to turn on the transistor when reading the stored data is between the threshold voltage of the transistor when storing "1" and the threshold voltage of the transistor when storing "0".

In the memory 1 provided in this embodiment, a first level is applied to the primary gate 105 through the word line 30 during a writing operation, and a storage signal is transmitted to the source of the memory cell 10 to be written through the bit line 20. The source delivers the storage signal to the drain, the drain delivers the storage signal to the secondary gate 101, and the node capacitors of the secondary gate 101 and the drain are used as the storage capacitor of the memory cell 10, thereby realizing data writing. During a reading operation, by using the influence of the voltage of the secondary gate 101 on the threshold voltage of the transistor, a second level is applied to the secondary gate 101 through the word line 30, and the data is read by detecting a magnitude of an output current of the transistor. Therefore, the reading/writing of the data can be realized by providing only one transistor in the memory cell 1, without additionally providing other transistors or capacitor devices, so that the structure of the memory cell 10 is greatly simplified and it is advantageous to improve the integration and storage density of the memory 1.

The memory cell 10 in the memory 1 provided in this embodiment includes only one transistor, and the film layer structure of the memory 1 will be described in detail in the following embodiments.

In some embodiments, as shown in FIGS. 5-8, the transistor further includes a first dielectric layer 104 and a second dielectric layer 102.

The first dielectric layer 104 is located between the semiconductor layer 103 and the primary gate 105.

The second dielectric layer 102 is located between the secondary gate 101 and the semiconductor layer 103 and between the secondary gate 101 and the source, and the orthographic projection of the source on the substrate 200 is partially overlapped with the orthographic projection of the secondary gate 101 on the substrate 200.

In the memory 1 provided in this embodiment, the second dielectric layer 102 is used as the dielectric material of the storage capacitor formed by the secondary gate 101 and the source. The first dielectric layer 104 is used to realize an insulating layer 106 between the primary gate 105 and the source and drain.

In some embodiments, as shown in FIGS. 5-8, the memory 1 provided in this embodiment further includes a buffer layer 300 which is located between the substrate 200 and the film layer (e.g., the secondary gate 101 in FIG. 5) closest to the substrate 200 in the transistor.

Optionally, the substrate 200 is made of silicon or glass, and the buffer layer 300 is made of an insulating material.

In some embodiments, as shown in FIG. 5, in the specific film layer structure in which the primary gate 105 and the secondary gate 101 are located on two sides of the semiconductor layer 103, respectively, and the transistor is of a top gate structure, the primary gate 105 is located on one side of the semiconductor layer 103 away from the substrate 200, and the secondary gate 101 is located between the substrate 200 and the semiconductor layer 103.

The transistor further includes a first insulating layer 106, a first via hole 107 and a second via hole 108.

The first insulating layer 106 is located on one side of the primary gate 105 away from the substrate 200.

The bit line 20 is located on one side of the first insulating layer 106 away from the primary gate 105.

The first via hole 107 passes through the first insulating layer 106 and the first dielectric layer 104, respectively, and is connected to the bit line 20 and the source contact region 1031 of the semiconductor layer 103, respectively. At least part of the entirety including the first via hole 107 and the source contact region 1031 of the semiconductor layer 103 forms the source.

The second via hole 108 passes through the first insulating layer 106, the first dielectric layer 104 and the second dielectric layer 102, respectively, and is connected to the drain contact region 1032 of the semiconductor layer 103 and the secondary gate 101, respectively. At least part of the entirety including the second via hole 108 and the drain contact region 1032 of the semiconductor layer 103 forms the drain.

As shown in FIG. 5, in the memory 1 provided in this embodiment, the bit line 20 is electrically connected to the source contact region 1031 of the semiconductor layer 103 through the first via hole 107 passing through the first insulating layer 106 and the first dielectric layer 104. The drain contact region 1032 of the semiconductor layer 103 may be electrically connected to the secondary gate 101 through the second via hole 108 passing through the second dielectric layer 102.

At least part of the entirety including the first via hole 107 and the source contact region 1031 of the semiconductor layer 103 may be regarded as the source. For example, part or all of the first via hole 107 may be regarded as the source, and part or all of the conducted source contact region 1031 in the semiconductor layer 103 may be regarded as the source.

Similarly, at least part of the entirety including the second via hole 108 and the drain contact region 1032 of the semiconductor layer 103 may be regarded as the drain. For example, part or all of the second via hole 108 may be regarded as the drain, and part or all of the conducted drain contact region 1032 in the semiconductor layer 103 may be regarded as the drain.

It is to be noted that, the second via hole 108 also passes through the first insulating layer 106 (like the first via hole 107), so the first via hole 107 and the second via hole 108 can be prepared by the same etching process, so that it is advantageous to further reduce the procedure and the production cost is reduced.

In the semiconductor layer 103, optionally, the material for forming the second via hole 108 may be the same as the material for forming the first via hole 107. Thus, the first via hole 107 and the second via hole 108 can be prepared by the same deposition process, so that it is advantageous to further reduce the procedure, and thus the production cost is reduced.

In some embodiments, as shown in FIG. 6, in the specific film layer structure in which the primary gate 105 and the secondary gate 101 are located on two sides of the semiconductor layer 103, respectively, and the transistor is of a bottom gate structure:

the primary gate 105 is located between the substrate 200 and the semiconductor layer 103, and the secondary gate 101 is located on one side of the semiconductor layer 103 away from the substrate 200.

The transistor further includes a first insulating layer 106, a first via hole 107 and a second via hole 108.

The first insulating layer 106 is located on one side of the secondary gate 101 away from the substrate 200.

The bit line 20 is located on one side of the first insulating layer 106 away from the secondary gate 101.

The first via hole 107 passes through the first insulating layer 106 and the second dielectric layer 102, respectively, and is connected to the bit line 20 and the source contact region 1031 of the semiconductor layer 103, respectively. At least part of the entirety including the first via hole 107 and the source contact region 1031 of the semiconductor layer 103 forms the source.

The second via hole 108 passes through the first insulating layer 106 and the second dielectric layer 102, respectively, and is connected to the secondary gate 101 and the drain contact region 1032 of the semiconductor layer 103, respectively. At least part of the entirety including the second via hole 108 and the drain contact region 1032 of the semiconductor layer 103 forms the drain.

In some embodiments, the word line 30 is arranged in the same layer as the primary gate 105 and is located in a different layer from the bit line 20.

As shown in FIG. 6, in the memory 1 provided in this embodiment, the word line 30 is located in a different layer from the bit line 20, so that it is advantageous for the mutual insulation between the both; and, the word line 30 is arranged in the same layer as the primary gate 105, so that it is advantageous to further reduce the procedure, and thus the production cost is further reduced. In some embodiments, the semiconductor layer 103 includes at least one of metal oxide semiconductor, monocrystalline silicon, polycrystalline silicon and amorphous silicon. The metal oxide semiconductor includes at least one of indium, gallium, zinc, tin and tungsten.

In the memory 1 provided in this embodiment, the material of the semiconductor layer 103 includes metal oxide. Due to the inherent characteristics (lower electron mobility and other factors) of the metal oxide semiconductor, when the material of the semiconductor layer 103 is metal oxide, the leakage current of the transistor can be reduced, and the speed of charge loss on the storage capacitor can be reduced. Thus, the data storage time of the memory 110 can be prolonged, and it is advantageous to reduce the refresh frequency and power consumption of the memory 110.

Specifically, the material of the metal oxide may be indium gallium zinc oxide (IGZO). When the material of the metal oxide is IGZO, the leakage current of the transistor is relatively low (the leakage current is lower than or equal to $10^{-15}$ A), so that a low refresh rate of the memory 1 is ensured. It is to be noted that, the material of the metal oxide may also be ITO, IWO, $ZnO_x$, $InO_x$, $In_2O_3$, InWO, $SnO_2$, $TiO_x$, $InSnO_x$, $Zn_xO_yN_z$, $Mg_xZn_yO_z$, $In_xZn_yO_z$, InxGayZnzOa, $Zr_xIn_yZn_zO_a$, $Hf_xIn_yZn_zO_a$, $Sn_xIn_yZn_zO_a$, $Al_xSn_yIn_zZn_aO_d$, $Si_xIn_yZn_zO_a$, $Zn_xSn_yO_z$, $Al_xZn_ySn_zO_a$, $Ga_xZn_ySn_zO_a$, $Zr_xZn_ySn_zO_a$, InGaSiO, etc., as long as the leakage current of the transistor can satisfy the requirements. The specific material may be adjusted according to the actual situation.

In order to further improve the integration of the memory 1, the memory 1 may include a plurality of memory cells 10. In some embodiments, at least two of the memory cells 10 are stacked in a direction perpendicular to the substrate 200.

Optionally, as shown in FIGS. 4-8, the memory 1 provided in this embodiment further includes a planarization layer 109 which is located on one side of the bit line 20 away from the substrate 200. The secondary gate 101 of the memory cell group 100 in an upper layer is manufactured on the planarization layer 109 of the memory cell group 100 in a lower layer, so that the stacking of the memory cell groups 100 in the direction perpendicular to the substrate 200 can be realized, and the memory 1 with high density and high integration is obtained.

In some embodiments, at least two of the memory cells 10 are arranged in an array on one side of the substrate 200, the primary gates 105 of the transistors in at least two of the memory cells 10 located in a same row are electrically connected to the same word line 30, and the sources of the transistors in at least two of the memory cells 10 located in a same column are electrically connected to the same bit line 20.

Figure 4:
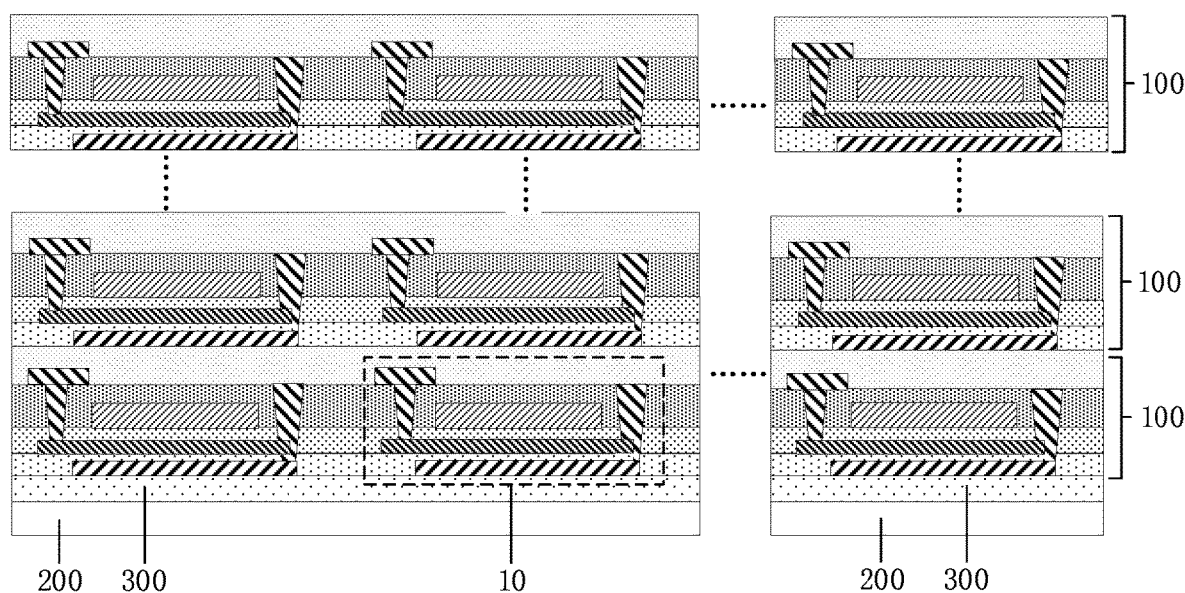
FIG. 4 is a schematic structure diagram of a memory according to an embodiment of the present disclosure.

As shown in FIG. 4, the memory 1 provided in this embodiment further includes a substrate 200, wherein a plurality of word lines 30, a plurality of bit lines 20 and a plurality of memory cells 10 are arranged on one side of the substrate 200; the plurality of memory cells 10 are divided into a plurality of memory cell groups 100, and the plurality of memory cell groups 100 are arranged in a direction perpendicular to the substrate 200; and, each memory cell group 100 includes a plurality of memory cells 100 arranged in an array in a direction parallel to the substrate 200, with the gates of the transistors in the memory cells 10 located in a same row being electrically connected to a same word line 30, and the sources of the transistors in the memory cells 10 located in a same column being electrically connected to a same bit line 20.

It is to be noted that, in the specific implementation process, different arrangement modes may be selected according to the specific storage capacity requirements and the space limitation of the memory 1. That is, the optimal design of the storage capacity and the storage space is realized by adjusting the number of the memory cell groups 100 and the number of the memory cells 100 in each memory cell group 100 (including adjusting the number of the memory cells 10 in each row and/or each column).

Figure 9:
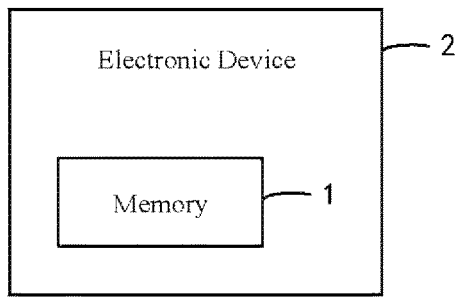
FIG. 9 is a schematic frame diagram of an electronic device according to an embodiment of the present disclosure.

Based on the same inventive concept, in accordance with an embodiment of the present disclosure, an electronic device 2 is provided. As shown in FIG. 9, the electronic device 2 includes the memory 1 according to any one of the above embodiments, and has beneficial effects of the memory 1 in the above embodiments, which are not repeated here.

Optionally, the electronic device in this embodiment of the present disclosure may include: a storage device, a smart phone, a computer, a tablet computer, an artificial intelligence device, a wearable device, a mobile power source, etc.

Figure 10:
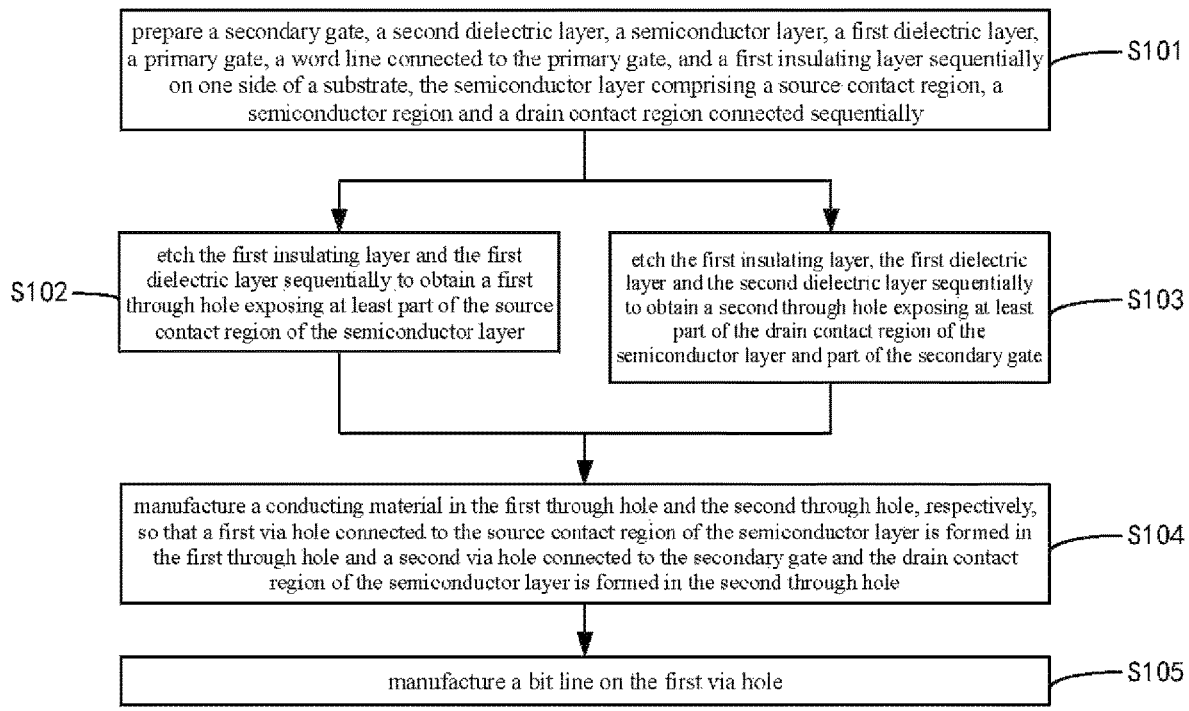
FIG. 10 is a flowchart of a method for manufacturing a memory according to an embodiment of the present disclosure.

Based on the same inventive concept, in accordance with an embodiment of the present disclosure, a method for manufacturing a memory 1 is provided. As shown in FIG. 10, the manufacturing method includes the following steps S101 to S105.

In S101, a secondary gate, a second dielectric layer, a semiconductor layer, a first dielectric layer, a primary gate, a word line connected to the primary gate, and a first insulating layer are prepared sequentially on one side of a substrate, the semiconductor layer includes a source contact region, a channel region and a drain contact region that are connected sequentially.

In some embodiments, the step S101 of preparing a secondary gate, a second dielectric layer, a semiconductor layer, a first dielectric layer, a primary gate, a word line connected to the primary gate, and a first insulating layer sequentially on one side of a substrate includes the following steps.

The secondary gate is prepared on one side of the substrate. Optionally, in this step, the secondary gate 101 is formed by depositing a first metal layer and patterning the first metal layer.

The second dielectric layer is prepared on the secondary gate and the exposed substrate. Optionally, the second dielectric layer 102 may be prepared by a full coating process.

The semiconductor layer is prepared on the second dielectric layer, so that an orthographic projection of the channel region of the semiconductor layer on the substrate and an orthographic projection of the source contact region of the semiconductor layer on the substrate are partially overlapped with an orthographic projection of the secondary gate on the substrate, respectively. Optionally, the semiconductor layer 103 may be formed by depositing a metal oxide layer on the second dielectric layer 102 and patterning the metal oxide layer.

The source contact region and the drain contact region of the semiconductor layer are conducted.

In S102, the first insulating layer and the first dielectric layer are etched sequentially to obtain a first through hole exposing at least part of the source contact region of the semiconductor layer. Thereafter, a step S104 will be executed.

In S103, the first insulating layer, the first dielectric layer and the second dielectric layer are etched sequentially to obtain a second through hole exposing at least part of the drain contact region of the semiconductor layer and part of the secondary gate. Thereafter, a step S104 will be executed.

In some embodiments, the step of etching the first insulating layer and the first dielectric layer sequentially to obtain a first through hole exposing at least part of the source contact region of the semiconductor layer and the step of etching the first insulating layer, the first dielectric layer and the second dielectric layer sequentially to obtain a second through hole exposing at least part of the drain contact region of the semiconductor layer and part of the secondary gate are performed synchronously. Thus, the first via hole 107 and the second via hole 108 may be prepared by the same etching process, so that it is advantageous to further reduce the procedure, and thus the production cost is reduced.

It is to be noted that the execution order of the step S102 and the step S103 is not limited in the present disclosure. It is also possible to execute the step S102 or the step S103 first.

In S104, conducting materials are prepared in the first through hole and the second through hole, respectively, so that a first via hole connected to the source contact region of the semiconductor layer is formed in the first through hole and a second via hole connected to the secondary gate and the drain contact region of the semiconductor layer is formed in the second through hole.

In some embodiments, the conducting materials in the first through hole and the second through hole may be the same conducting material, e.g., the same type of metal material.

In S105, a bit line is manufactured on the first via hole.

In some embodiments, in the step S105, a plurality of bit lines 20 may be formed by depositing a third metal layer and patterning the third metal layer, and the bit lines 20 are electrically connected to the source through a first through path (i.e., the first via hole 107).

A memory may be prepared by the above steps S101 to S105. The transistor in the memory has a top gate structure, and the primary gate and the secondary gate are located on two sides of the semiconductor layer, respectively.

In the method for manufacturing a memory provided in this embodiment, since the memory cell 10 in the memory includes only one transistor, the number of film layers can be decreased, it is advantageous to reduce the procedure, and thus the production cost is reduced. In addition, the reading/writing of data can be realized by providing only one transistor in the memory cell 10 without additionally providing other transistors or capacitor devices, the structure of the memory cell 10 is greatly simplified, and it is advantageous to improve the integration and storage density of the dynamic memory.

Figure 11:
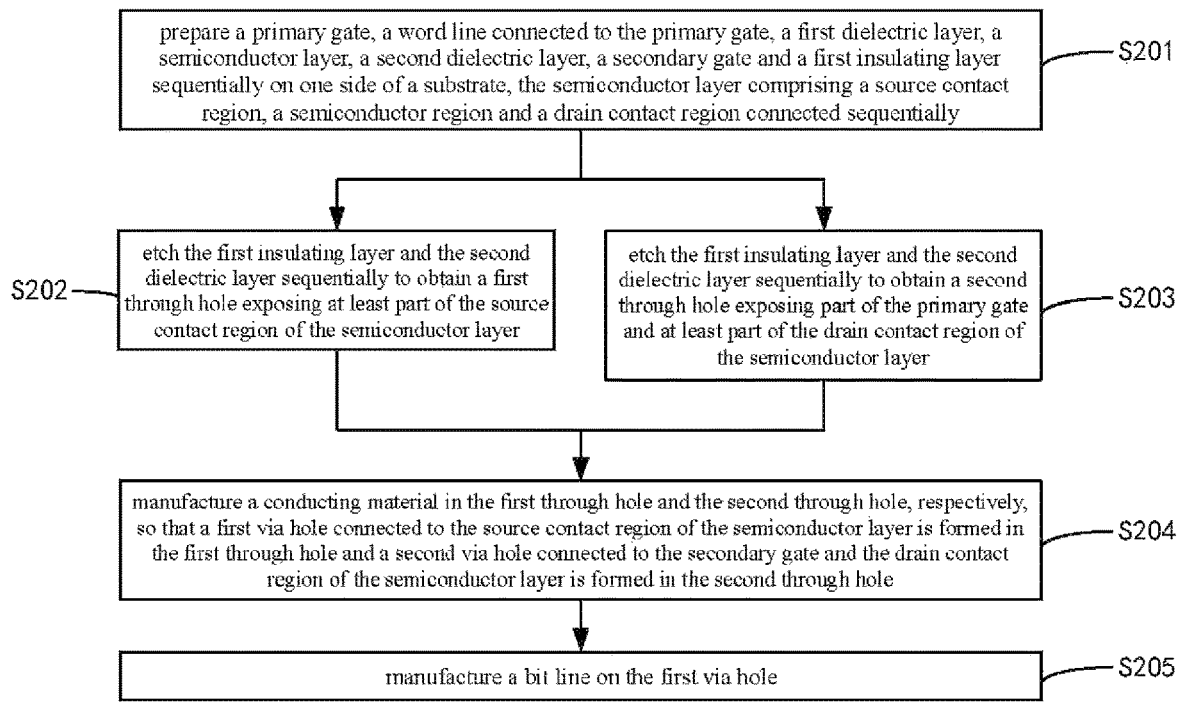
FIG. 11 is a flowchart of another method for manufacturing a memory according to an embodiment of the present disclosure.

Based on the same inventive concept, in accordance with an embodiment of the present disclosure, another method for manufacturing a memory 1 is provided. As shown in FIG. 11, the manufacturing method includes the following steps S201 to S205.

In S201, a primary gate, a word line connected to the primary gate, a first dielectric layer, a semiconductor layer, a second dielectric layer, a secondary gate and a first insulating layer are prepared sequentially on one side of a substrate, the semiconductor layer includes a source contact region, a channel region and a drain contact region that are connected sequentially.

In some embodiments, the step S201 of preparing a primary gate, a word line connected to the primary gate, a first dielectric layer, a semiconductor layer, a second dielectric layer, a secondary gate and a first insulating layer sequentially on one side of a substrate includes the following steps.

The primary gate and the word line connected to the primary gate are prepared on one side of the substrate. Optionally, in this step, the primary gate and the word line connected to the primary gate are formed by depositing a second metal layer and patterning the second metal layer.

The first dielectric layer is prepared on the primary gate, the word line connected to the primary gate and the exposed substrate. Optionally, the first dielectric layer may be prepared by a full coating process.

The semiconductor layer is prepared on the first dielectric layer, so that an orthographic projection of the channel region of the semiconductor layer on the substrate is partially overlapped with an orthographic projection of the primary gate on the substrate. Optionally, the semiconductor layer may be formed by depositing a metal oxide layer on the first dielectric layer and patterning the metal oxide layer.

The source contact region and the drain contact region of the semiconductor layer are conducted.

The second dielectric layer is prepared on the semiconductor layer and the exposed first dielectric layer. Optionally, the second dielectric layer may be prepared by a full coating process.

The secondary gate is prepared on the second dielectric layer, so that an orthographic projection of the secondary gate on the substrate is partially overlapped with an orthographic projection of the channel region of the semiconductor layer on the substrate and an orthographic projection of the source contact region of the semiconductor layer on the substrate, respectively. Optionally, in this step, the secondary gate 101 is formed by depositing a first metal layer and patterning the first metal layer.

In S202, the first insulating layer and the second dielectric layer are etched sequentially to obtain a first through hole exposing at least part of the source contact region of the semiconductor layer. Thereafter, a step S204 will be executed.

In S203, the first insulating layer and the second dielectric layer are etched sequentially to obtain a second through hole exposing part of the secondary gate and at least part of the drain contact region of the semiconductor layer. Thereafter, a step S204 will be executed.

In some embodiments, the step of etching the first insulating layer and the second dielectric layer sequentially to obtain a first through hole exposing at least part of the source contact region of the semiconductor layer and the step of etching the first insulating layer and the second dielectric layer sequentially to obtain a second through hole exposing part of the primary gate and at least part of the drain contact region of the semiconductor layer are performed synchronously. Thus, the first via hole 107 and the second via hole 108 may be prepared by the same etching process, so that it is advantageous to further reduce the procedure, and thus the production cost is reduced.

It is to be noted that the execution order of the step S202 and the step S203 is not limited in the present disclosure. It is also possible to execute the step S202 or the step S203 first.

In S204, conducting materials are prepared in the first through through hole and the second through hole, respectively, so that a first via hole connected to the source contact region of the semiconductor layer is formed in the first through hole and a second via hole connected to the secondary gate and the drain contact region of the semiconductor layer is formed in the second through hole.

In some embodiments, the conducting materials in the first through hole and the second through hole may be the same conducting material, e.g., the same type of metal material.

In S205, a bit line is manufactured on the first via hole.

In some embodiments, in the step S105, a plurality of bit lines 20 may be formed by depositing a third metal layer and patterning the third metal layer, and the bit lines 20 are electrically connected to the source through a first through path (i.e., the first via hole 107).

Another memory may be prepared by the above steps S201 to S205. The transistor in the memory has a bottom gate structure, and the primary gate and the secondary gate are located on two sides of the semiconductor layer, respectively.

For the convenience of understanding, this embodiment further provides a specific method for manufacturing a memory. The method is used to manufacture a memory having a top gate structure. The manufacturing method includes steps S301 to S310.

Figure 12:
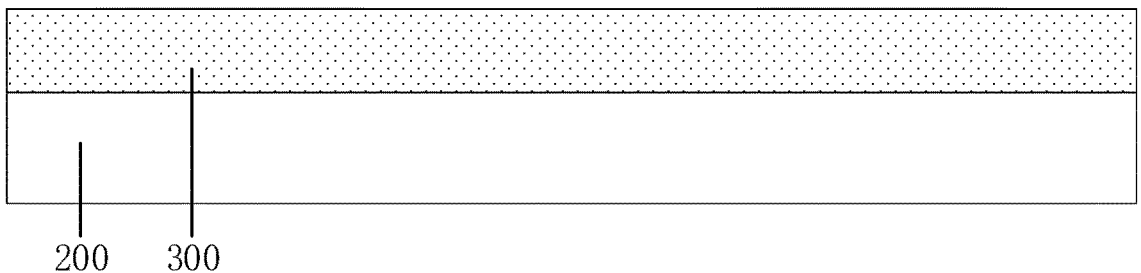
FIG. 12 is a schematic diagram of a film layer structure after step S301 in the specific method for manufacturing a memory according to an embodiment of the present disclosure.

In S301, a substrate 200 is provided, and a buffer layer 300 is formed on the substrate 200. The film layer structure after this step S301 is shown in FIG. 12.

Figure 13:
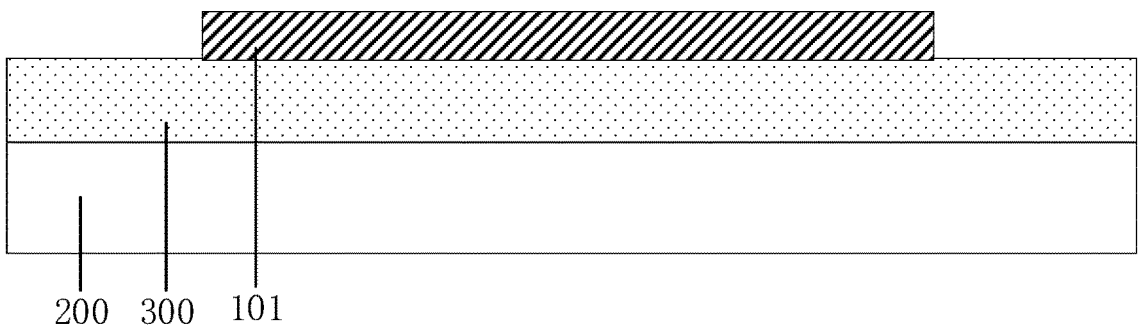
FIG. 13 is a schematic diagram of a film layer structure after step S302 in the specific method for manufacturing a memory according to an embodiment of the present disclosure.

In S302, a plurality of secondary gates 101 are formed on the substrate 200 by a patterning process. The film layer structure after this step S302 is shown in FIG. 13.

Figure 14:
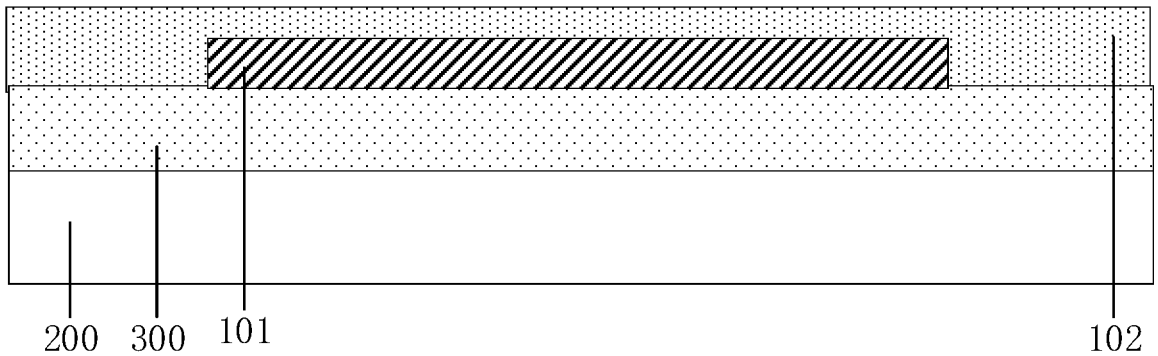
FIG. 14 is a schematic diagram of a film layer structure after step S303 in the specific method for manufacturing a memory according to an embodiment of the present disclosure.

In S303, a second dielectric layer 102 is formed on the secondary gate 101. The film layer structure after this step S303 is shown in FIG. 14.

Figure 15:
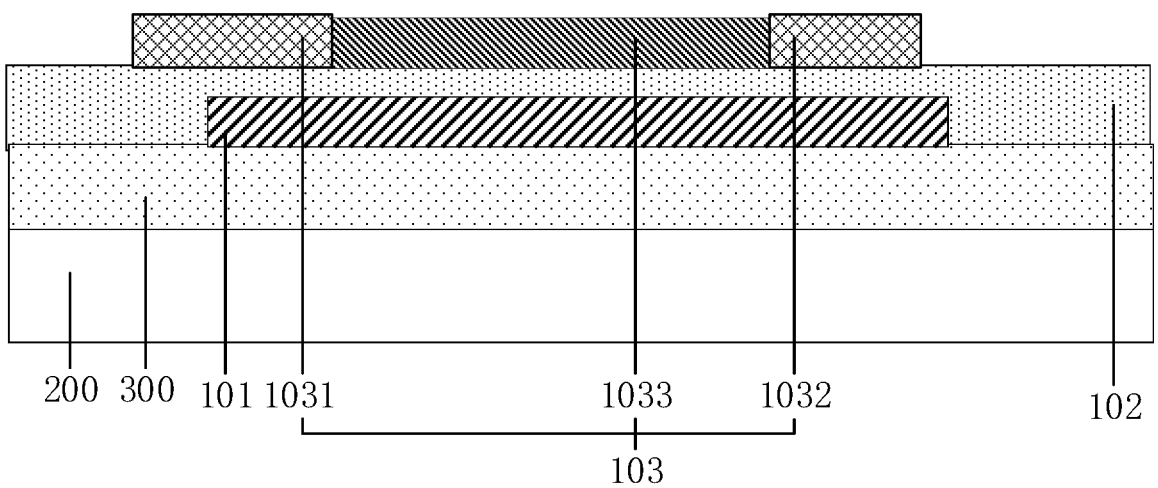
FIG. 15 is a schematic diagram of a film layer structure after step S304 in the specific method for manufacturing a memory according to an embodiment of the present disclosure.

In S304, a metal oxide is deposited on the second dielectric layer to serve as a semiconductor layer 103, so that an orthographic projection of the channel region of the semiconductor layer on the substrate and an orthographic projection of the source contact region of the semiconductor layer on the substrate are partially overlapped with orthographic projections of the secondary gates on the substrate, respectively. The film layer structure after this step S304 is shown in FIG. 15.

Figure 16:
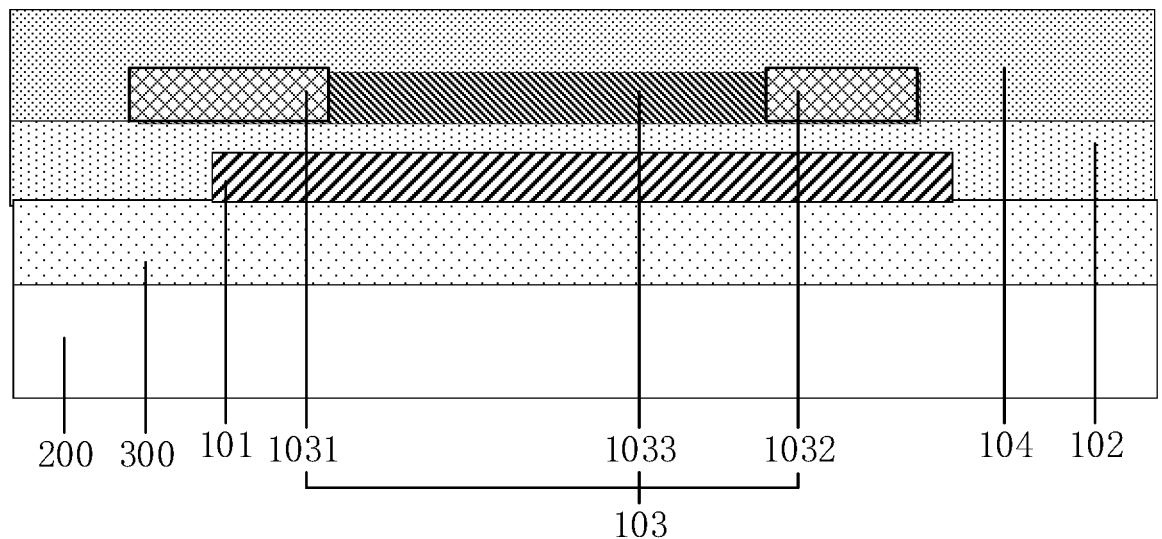
FIG. 16 is a schematic diagram of a film layer structure after step S305 in the specific method for manufacturing a memory according to an embodiment of the present disclosure.

In S305, a first dielectric layer 104 is formed on the semiconductor layer 103. The film layer structure after this step S305 is shown in FIG. 16.

Figure 17:
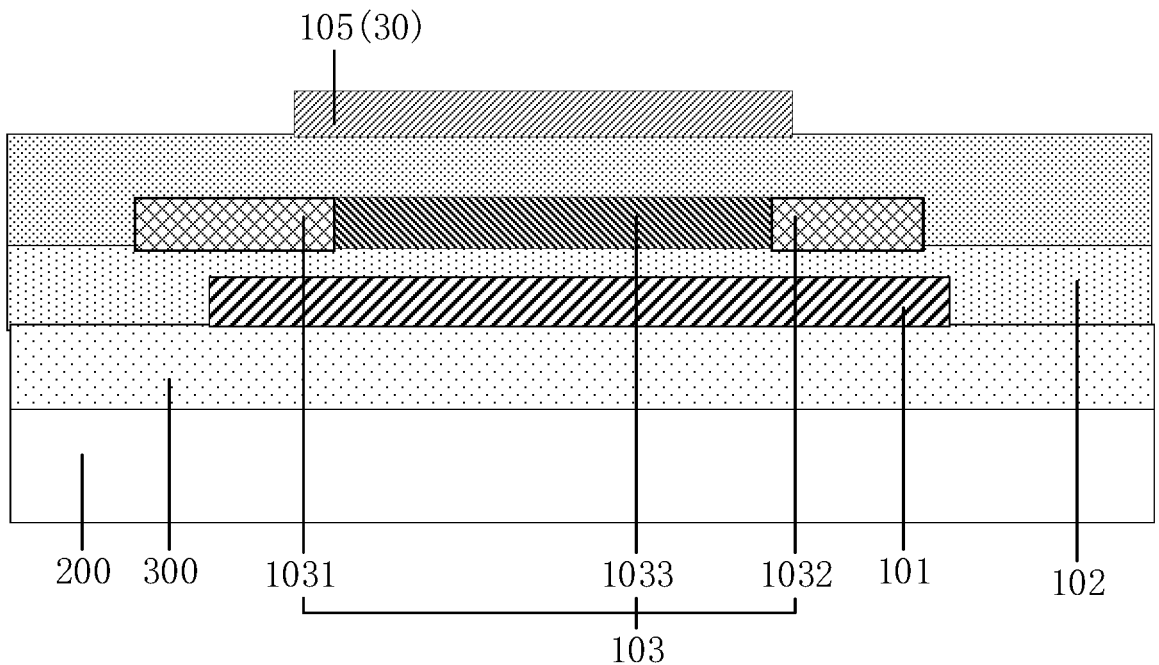
FIG. 17 is a schematic diagram of a film layer structure after step S306 in the specific method for manufacturing a memory according to an embodiment of the present disclosure.

In S306, a plurality of primary gates 105 and word lines 30 connected to the primary gates 105 are formed on the first dielectric layer 104 by a patterning process. The film layer structure after this step S306 is shown in FIG. 17.

Figure 18:
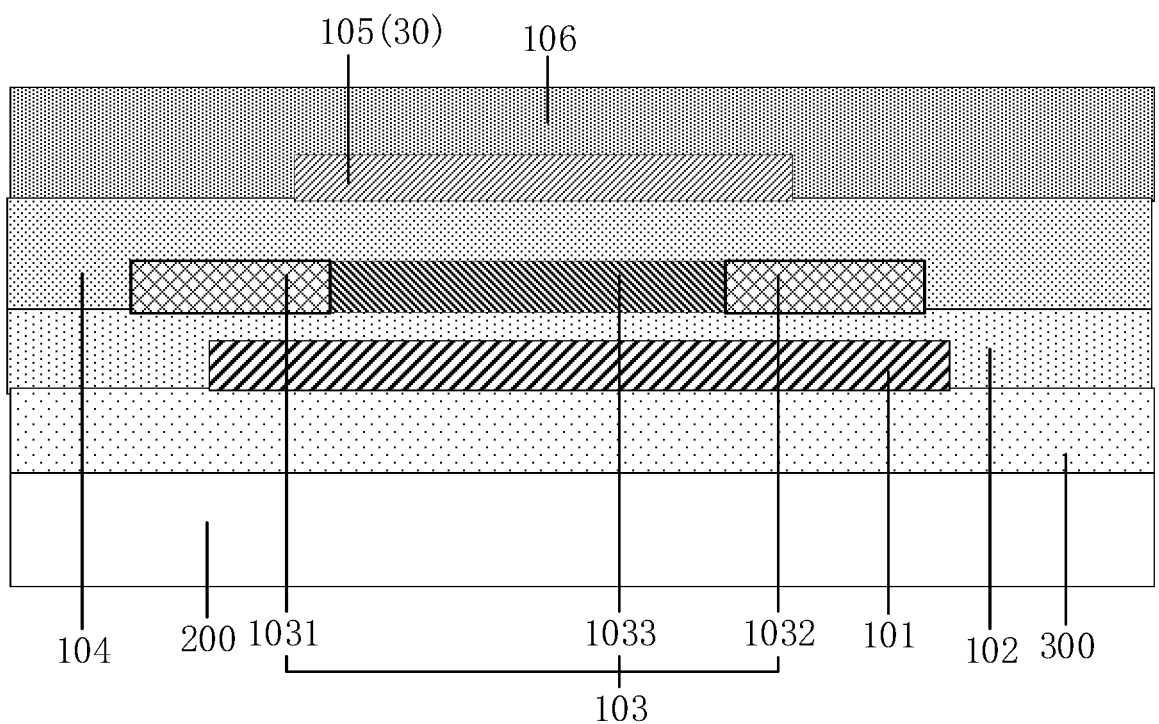
FIG. 18 is a schematic diagram of a film layer structure after step S307 in the specific method for manufacturing a memory according to an embodiment of the present disclosure.

In S307, an insulating layer 106 is formed on the primary gates 105. The film layer structure after this step S307 is shown in FIG. 18.

Figure 19:
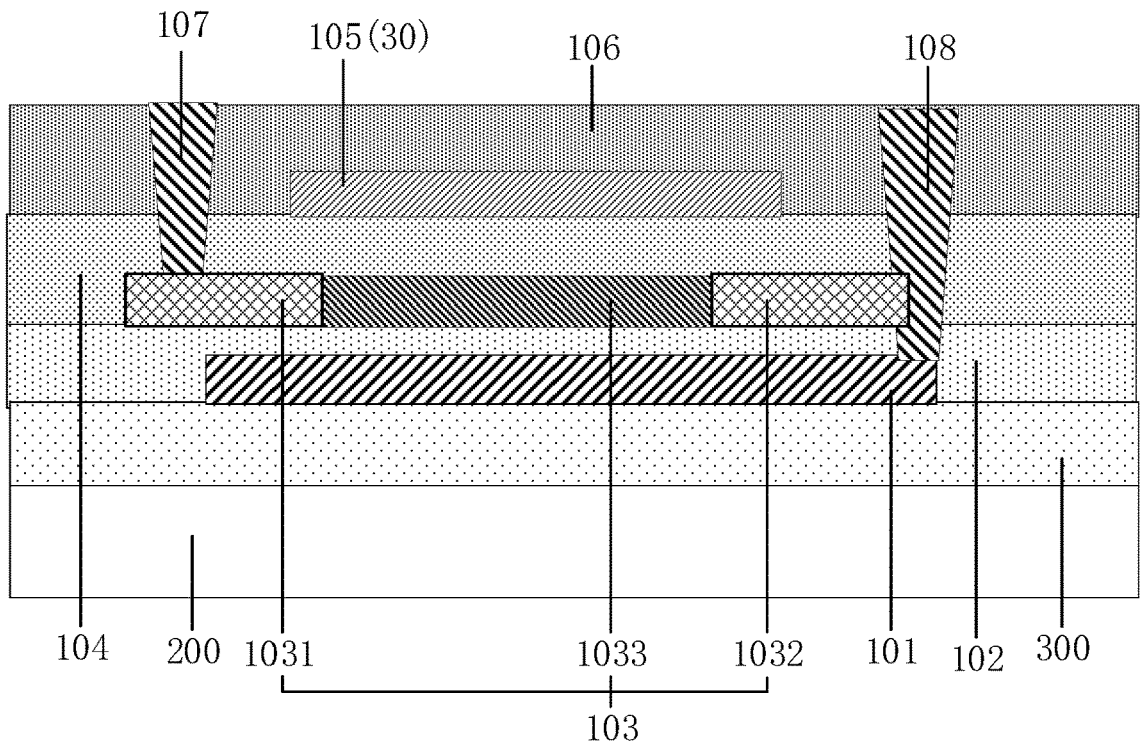
FIG. 19 is a schematic diagram of a film layer structure after step S308 in the specific method for manufacturing a memory according to an embodiment of the present disclosure.

In S308, a first via hole 107 passing through the insulating layer 106 and the first dielectric layer 104 and a second via hole 108 passing through the insulating layer 106, the first dielectric layer 104, the semiconductor layer 103 and the second dielectric layer 102 are formed. At least part of the entirety including the first via hole and the source contact region of the semiconductor layer forms the source, and at least part of the entirety including the second via hole and the drain contact region of the semiconductor layer forms the drain. The film layer structure after this step S308 is shown in FIG. 19.

Figure 20:
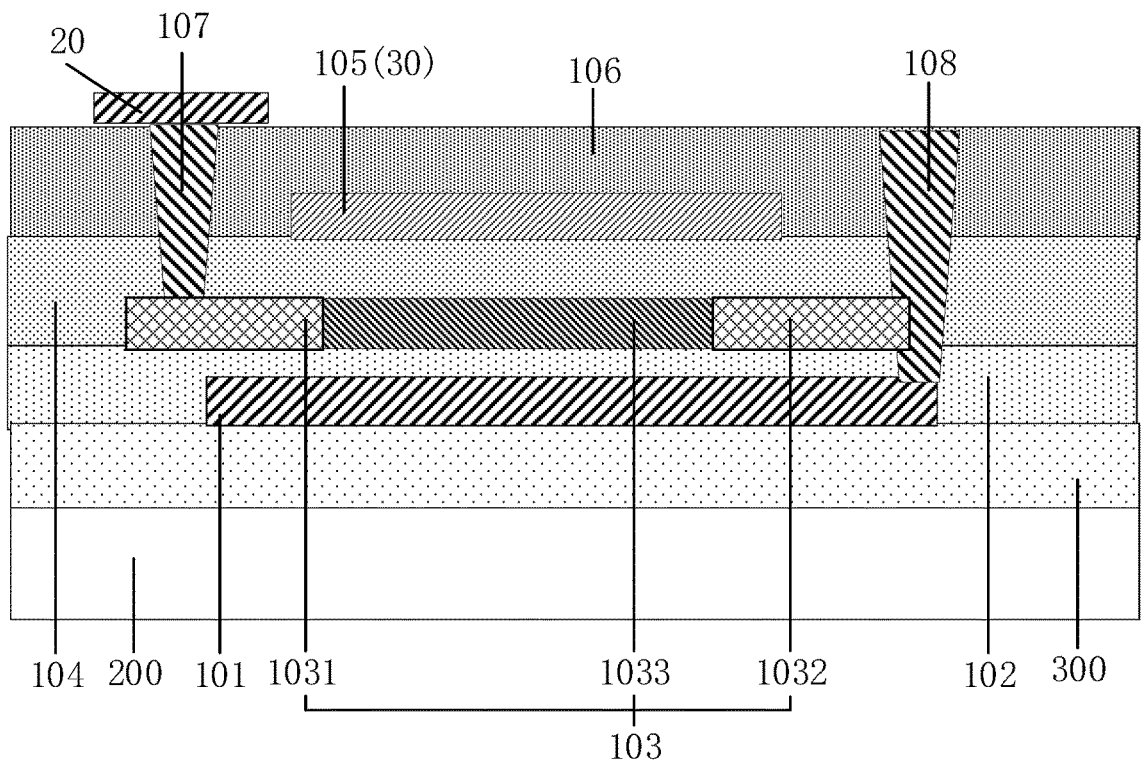
FIG. 20 is a schematic diagram of a film layer structure after step S309 in the specific method for manufacturing a memory according to an embodiment of the present disclosure.

In S309, a plurality of bit lines 20 are formed by a patterning process, the bit lines 20 being electrically connected to the source contact region of the semiconductor layer through the first via hole 107. The film layer structure after this step S309 is shown in FIG. 20.

Figure 21:
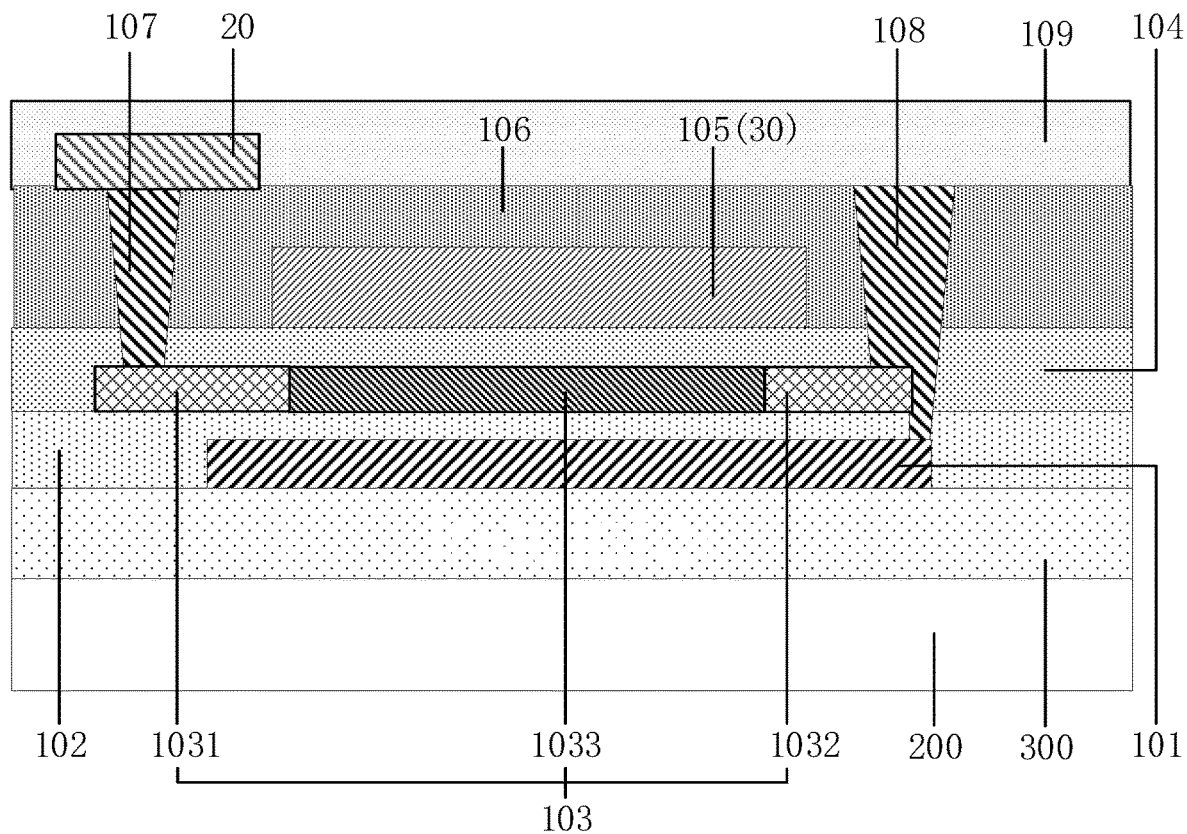
FIG. 21 is a schematic diagram of a film layer structure after step S310 in the specific method for manufacturing a memory according to an embodiment of the present disclosure.
Figure 22:
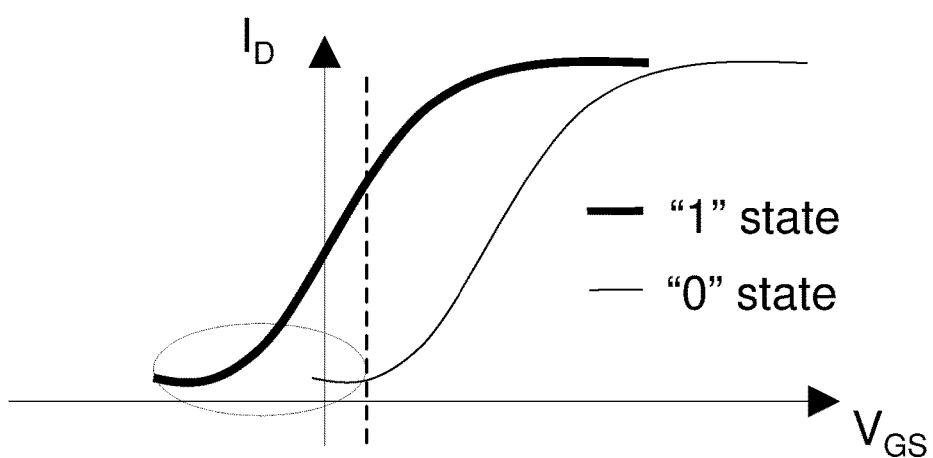
FIG. 22 is a graph showing the transfer characteristics of the transistors in the memory when different data is written according to an embodiment of the present disclosure.

In S310, a planarization layer 109 is formed on one side of the bit lines 20 away from the substrate 200. The film layer structure after this step S310 is shown in FIG. 21.

It should be understood that a dynamic memory including a plurality of memory cells stacked in a direction perpendicular to the substrate can be obtained by repeatedly executing the steps S302 to S310 on the planarization layer 109. During the formation of the memory cell in the lowest layer, a plurality of secondary gates 101 are formed on the buffer layer 300 by a patterning process; and, during the formation of other memory cells, a plurality of secondary gates 101 are formed on the planarization layer 109 of the memory cell in the lower layer by a patterning process.

Based on the same inventive concept, in accordance with an embodiment of the present disclosure, a reading/writing method is provided to perform reading/writing on the memory in the above embodiments. The reading/writing method includes T1 to T2.

In T1, in a writing state, a first level is applied to the primary gate 105 of the memory cell 10 to be written through the word line 30 to turn on the transistor, and a storage signal is transmitted to the source of the memory cell 10 to be written through the bit line 20, so that the storage signal is written into the storage unit 10 to be written as stored data.

When the dynamic memory is in a writing mode, a first level (e.g., 5 V, the specific numerical value may be adjusted according to the actual situation) is applied to the primary gate 105 through the word line 30, so that the transistor is in the ON state. The magnitude of the first level is related to the structure of the transistor, the material of the semiconductor layer 103 in the transistor and other factors, and may be specifically adjusted according to the actual situation.

When the transistor is turned on, a voltage is applied to the source through the bit line 20 according to the externally input data, the source and the drain are turned on through the semiconductor layer 103, and the drain and the secondary gate 101 are electrically connected. Therefore, the magnitudes of the voltages on the source and the drain are the same as that of the voltage on the secondary gate 101 (the drain and the secondary gate 101 are the same in potential). The node capacitors of the secondary gate 101 and the drain form the storage capacitor of the memory cell 10, and the amount of charge in the storage capacitor is determined by the magnitude of the voltage on the secondary gate 101, and thus whether the binary of the data signal stored in the memory cell 10 is 0 or 1 is determined. When a high voltage (e.g., 5 V) is applied to the source through the bit line 20, the data "1" is written into the memory cell 10. When a low voltage (e.g., 0 V) is applied to the source through the bit line 20, the data "0" is written into the memory cell 10.

In T2, in a reading state, a second level is applied to the primary gate 105 of the memory cell 10 to be read through the word line 30, so that the bit line 20 senses the stored data in the memory cell 10 to be read.

When the dynamic memory is in a reading mode, a second level is applied to the primary gate 105 through the word line 30, so that there is a voltage difference between the primary gate 105 and the source. Meanwhile, the magnitude of the current on the bit line 20 (i.e., the output current of the transistor) is detected to realize data reading.

Specifically, when the data previously stored in the memory cell 10 is "1", the secondary gate 101 and the drain have a high potential. Under the joint action of the first level and the second level, the transistor is in the ON state, so a significant current can be measured through the bit line 20. When a significant current is measured, the read data is determined as "1". When the data previously stored in the memory cell 10 is "0", the secondary gate 101 and the drain have a low potential. After the second level is applied to the primary gate 105, the transistor is still in the OFF state, so the current measured by the bit line 2032 is very weak. In this case, the read data is determined as "0".

It is to be noted that the magnitude of the threshold voltage of the transistor is related to magnitudes of the potentials on the secondary gate 101 and the drain. For an N-type field effect transistor (the carrier is electrons when the transistor is turned on), if the potentials on the secondary gate 101 and the drain are higher, the threshold voltage is lower. That is, the transistor can still be turned on when the voltage difference between the primary gate 105 and the source is relatively small. If the potentials on the secondary gate 101 and the drain are lower, the threshold voltage is higher.

As shown in FIG. 21, the horizontal axis in FIG. 21 represents the voltage (e.g., the second level) applied to the primary gate 105, and the vertical axis represents the output current of the transistor. When the second level applied to the primary gate 105 is a specific value (the dashed line in FIG. 21), the magnitudes of the voltages on the secondary gate 101 and the drain (that is, the data written by the transistor is "1" or "0") will lead to a significant difference in the magnitude of the output current of the transistor (i.e., the current measured by the bit line 20). The data can be read out from the memory cell 10 by detecting the current on the bit line 20. When the data written by the transistor is "1", the output current of the transistor is higher, and the read data is also "1". When the data written by the transistor is "0", the output current of the transistor is extremely weak, so the read data is also "0".

The numerical value of the second level may be determined according to the parameters of the transistors and the magnitudes of the voltages applied to the secondary gate 101 and the drain during the writing operation. It is to be noted that the numerical value of the second level should be appropriate (it should be between the threshold voltage when the transistor stores "1" and the threshold voltage when the transistor stores "0"). If the numerical value of the second level is not appropriate, the magnitude of the output current of the transistor when storing the data "1" (that is, the potentials on the drain and the secondary gate 101 are high) will be very close to the magnitude of the output current of the transistor when storing the data "0" (that is, the potentials on the drain and the secondary gate 101 are low). As a result, during the reading operation, it is difficult to determine whether the read data is "0" or "1", which will affect the performance of the dynamic memory. The most appropriate value of the second level may be determined by experiment or simulation, so that the difference in the output current of the transistor during the reading operation in different states is maximized to improve the reading performance.

By applying the embodiments of the present disclosure, at least the following beneficial effects can be achieved.

1. In the memory cell provided in the present disclosure, on the basis that the transistor has a primary gate that can control the conductivity of the semiconductor layer, a secondary gate that can also control the conductivity of the semiconductor layer is introduced. The secondary gate is electrically connected to the drain, so that the secondary gate can obtain a fixed potential synchronized with the drain and provides supplementary control for the semiconductor layer by using the fixed potential. In addition, the secondary gate is not electrically connected to the source, so that the secondary gate can play a role of the negative bias of the threshold voltage in the reading stage. Thus, the performance of the transistor can be improved, and the reading/writing performance of the memory can be thus optimized.

2. In a solution of connecting a secondary gate to the drain to improve the reading/writing performance, the secondary gate is not connected to any electrode other than the drain and is located on the other side of the semiconductor layer, that is, the secondary gate and the primary gate are located on two sides of the semiconductor layer. The secondary gate in the present application is not a floating gate, and must has a fixed potential that must be synchronized with the drain, so it is suitable to the reading/writing scenario of the memory. The secondary gate in the present application is not connected to the source, and the secondary gate plays a role of the Vth negative bias in the reading stage.

3. The memory cell 10 provided in the present disclosure includes a capacitor storage structure formed between the secondary gate and the first electrode, so that the data can be written and the current leakage of the transistor in the OFF state can be improved. By using the secondary gate as a part of the capacitor storage structure, it is advantageous for the device to realize relatively high integration.

4. In the memory cell provided in the present disclosure, by using the source as another part of the capacitor storage structure and cooperating with the secondary gate to realize data writing, the integration of the memory is further improved. That is, the reading/writing of the data can be realized by providing only one transistor in the memory cell of the memory, without additionally providing other transistors or capacitor devices, so that the structure of the memory cell is greatly simplified and it is advantageous to improve the integration and storage density of the memory.

It should be understood by those skilled in the art that the steps, measures and solutions in the operations, methods and flows already discussed in the present disclosure can be alternated, changed, combined or deleted. Further, other steps, measures and solutions including the operations, methods and flows already discussed in the present disclosure can also be alternated, changed, rearranged, decomposed, combined or deleted. Further, the steps, measures and solutions of the prior art including the operations, methods and flows disclosed in the present disclosure can also be alternated, changed, rearranged, decomposed, combined or deleted.

In the description of the present disclosure, the orientation or position relation indicated by terms "upper", "lower", "vertical", "horizontal" or the like is an exemplary orientation or position relation shown based on the drawings, merely for describing the embodiments of the present disclosure or simplifying the description, rather than indicating or implying that the specified device or component must have a particular orientation or be constructed and operated in a particular orientation. Therefore, it should not be interpreted as limitations to the present disclosure.

The terms "first" and "second" are merely for illustrative purpose, and should not be interpreted as indicating or implying the relative importance or implicitly indicating the number of the specified technical features. Therefore, the features defined by the terms "first" and "second" may explicitly or implicitly include one or more features. In the description of the present disclosure, unless otherwise stated, "a plurality of" means two or more.

It is to be noted that, unless otherwise expressly specified and defined, the terms "mounting", "joint" and "connection" should be interpreted in a broad sense. For example, the connection may be fixed connection, detachable connection or integral connection; or, may be direct connection or indirect connection through an intermediate member; or, may be internal communication between two elements. A person of ordinary skill in the art can understand the specific meanings of the terms in the present disclosure according to the specific situation.

In the description of the specification, specific features, structures, materials or characteristics can be combined appropriately in any one or more embodiments or examples.

It should be understood that, although the steps in the flowcharts in the drawings are shown sequentially as indicated by arrows, the implementation order of these steps is not limited to the order indicated by the arrows. Unless explicitly stated herein, in some implementation scenarios of the embodiments of the present disclosure, the steps in the flowcharts may be executed in other orders as required. In addition, based on the actual implementation scenario, some or all of the steps in the flowcharts may include a plurality of sub-steps or stages. Some or all of these sub-steps or stages may be executed at the same moment, or may be executed at different moments. In a scenario where the sub-steps or stages are executed at different moments, the execution order of these sub-steps or stages may be flexibly configured according to the requirements. It will not be limited in the embodiments of the present disclosure.

The foregoing description merely shows some implementations of the present disclosure. It should be pointed out that, to a person of ordinary skill in the art, without departing from the technical concept of the solutions of the present disclosure, the use of other similar implementation means based on the technical concept of the present disclosure also belongs to the protection scope of the embodiments of the present disclosure.

What is claimed is:

1. A memory, comprising a substrate, and word lines, bit lines and memory cells on one side of the substrate;
each of the memory cells comprises a transistor, and the transistor comprises:
a semiconductor layer comprising a source contact region, a channel region and a drain contact region connected sequentially;
a primary gate electrically connected to one of the word lines;
a source electrically connected to one of the bit lines and the source contact region of the semiconductor layer, respectively;
a drain electrically connected to the drain contact region of the semiconductor layer; and
a secondary gate electrically connected to the drain;
wherein an orthographic projection of the primary gate on the substrate and an orthographic projection of the secondary gate on the substrate are at least partially overlapped with an orthographic projection of the channel region of the semiconductor layer on the substrate, respectively;
the memory cell further comprises a storage structure comprising the secondary gate,
wherein a node capacitors between the secondary gate and the drain being used as a storage capacitor of the memory cell, so that data "1" or "0" is stored in the storage capacitor in a writing state, and whether "1" or "0" being stored is determined according to ON or OFF of the transistor in a reading state,
wherein the storage structure further comprises a first electrode, the storage capacitor being formed between the secondary gate and the first electrode, and wherein the primary gate is located between the substrate and the semiconductor layer, the secondary gate is located on one side of the semiconductor layer away from the substrate, and the first electrode is located on one side of the secondary gate away from the substrate.

2. The memory according to claim 1, wherein the primary gate and the secondary gate are located on two opposite sides of the semiconductor layer, respectively.

3. The memory according to claim 1, wherein the first electrode is the source, and an orthographic projection of the source on the substrate is partially overlapped with the orthographic projection of the secondary gate on the substrate.

4. The memory according to claim 1, wherein the one of the word lines is arranged in the same layer as the primary gate and is located in a different layer from the bit line.

5. The memory according to claim 1, wherein the semiconductor layer comprises at least one of metal oxide semiconductor, monocrystalline silicon, polycrystalline silicon and amorphous silicon,
wherein the metal oxide semiconductor comprises at least one of indium, gallium, zinc, tin and tungsten.

6. The memory according to claim 1, wherein at least two of the memory cells are stacked in a direction perpendicular to the substrate;
and/or, at least two of the memory cells are arranged in an array on one side of the substrate, the primary gates of the transistors in at least two of the memory cells located in a same row are electrically connected to same one of the word lines, and the sources of the transistors in at least two of the memory cells located in a same column are electrically connected to same one of the bit lines.

7. An electronic device, comprising the memory according to claim 1.

8. The memory according to claim 1, wherein the transistor further comprises:
a first dielectric layer between the semiconductor layer and the primary gate; and
a second dielectric layer between the secondary gate and the semiconductor layer and between the secondary gate and the source, an orthographic projection of the source on the substrate being partially overlapped with the orthographic projection of the secondary gate on the substrate.

9. The memory according to claim 8, wherein the primary gate is located on one side of the semiconductor layer away from the substrate, and the secondary gate is located between the substrate and the semiconductor layer;
the transistor further comprises a first insulating layer, a first via hole and a second via hole;
the first insulating layer is located on one side of the primary gate away from the substrate;
the one of the bit lines is located on one side of the first insulating layer away from the primary gate;
the first via hole passes through the first insulating layer and the first dielectric layer, respectively, and is connected to the one of the bit lines and the source contact region of the semiconductor layer, respectively, and at least part of an entirety including the first via hole and the source contact region of the semiconductor layer forms the source; and
the second via hole passes through the first insulating layer, the first dielectric layer and the second dielectric layer, respectively, and is connected to the drain contact region of the semiconductor layer and the secondary gate, respectively, and at least part of an entirety including the second via hole and the drain contact region of the semiconductor layer forms the drain.

10. The memory according to claim 8, wherein the primary gate is located between the substrate and the semiconductor layer, and the secondary gate is located on one side of the semiconductor layer away from the substrate;
the transistor further comprises a first insulating layer, a first via hole and a second via hole;
the first insulating layer is located on one side of the secondary gate away from the substrate;
the one of the bit lines is located on one side of the first insulating layer away from the secondary gate;
the first via hole passes through the first insulating layer and the second dielectric layer, respectively, and is connected to the one of the bit lines and the source contact region of the semiconductor layer, respectively, and at least part of an entirety including the first via hole and the source contact region of the semiconductor layer forms the source; and
the second via hole passes through the first insulating layer and the second dielectric layer, and is connected to the secondary gate and the drain contact region of the semiconductor layer, respectively, and at least part of an entirety including the second via hole and the drain contact region of the semiconductor layer forms the drain.

11. A method for manufacturing a memory, comprising steps of:
forming a memory cell comprising a transistor on one side of a substrate, the forming comprises:
preparing a secondary gate, a second dielectric layer, a semiconductor layer, a first dielectric layer, a primary gate, a word line connected to the primary gate, and a first insulating layer sequentially on one side of a substrate, the semiconductor layer comprising a source contact region, a channel region and a drain contact region connected sequentially;
etching the first insulating layer and the first dielectric layer sequentially to obtain a first through hole exposing at least part of the source contact region of the semiconductor layer;
etching the first insulating layer, the first dielectric layer and the second dielectric layer sequentially to obtain a second through hole exposing at least part of the drain contact region of the semiconductor layer and part of the secondary gate;
manufacturing conducting materials in the first through hole and the second through hole, respectively, so that a first via hole connected to the source contact region of the semiconductor layer is formed in the first through hole and a second via hole connected to the secondary gate and the drain contact region of the semiconductor layer is formed in the second through hole; and
manufacturing a bit line on the first via hole so that the bit line is electrically connected to the source contact region;
wherein the memory cell further comprises a storage structure comprising the secondary gate,
wherein a node capacitors between the secondary gate and the drain being used as a storage capacitor of the memory cell, so that data "1" or "0" is stored in the storage capacitor in a writing state, and whether "1" or "0" being stored is determined according to ON or OFF of the transistor in a reading state,
wherein the storage structure further comprises a first electrode, the storage capacitor being formed between the secondary gate and the first electrode, and wherein the primary gate is located between the substrate and the semiconductor layer, the secondary gate is located on one side of the semiconductor layer away from the substrate, and the first electrode is located on one side of the secondary gate away from the substrate.

12. The method for manufacturing a memory according to claim 11, wherein the step of preparing a secondary gate, a second dielectric layer, a semiconductor layer, a first dielectric layer, a primary gate, a word line connected to the primary gate, and a first insulating layer sequentially on one side of a substrate comprises:

preparing the secondary gate on the one side of the substrate;

preparing the second dielectric layer on the secondary gate and the exposed substrate;

preparing the semiconductor layer on the second dielectric layer, so that an orthographic projection of the channel region of the semiconductor layer on the substrate and an orthographic projection of the source contact region of the semiconductor layer on the substrate are partially overlapped with an orthographic projection of the secondary gate on the substrate, respectively; and making the source contact region and the drain contact region of the semiconductor layer to be conductive.

13. The method for manufacturing a memory according to claim 11, wherein, the step of etching the first insulating layer and the first dielectric layer sequentially to obtain a first through hole exposing at least part of the source contact region of the semiconductor layer and the step of etching the first insulating layer, the first dielectric layer and the second dielectric layer sequentially to obtain a second through hole exposing at least part of the drain contact region of the semiconductor layer and part of the secondary gate are performed synchronously.

* * * * *